US 11,581,170 B2

(12) United States Patent
Kubota et al.

(10) Patent No.: US 11,581,170 B2
(45) Date of Patent: Feb. 14, 2023

(54) PLASMA PROCESSING APPARATUS AND PROCESSING METHOD

(71) Applicant: TOKYO ELECTRON LIMITED, Tokyo (JP)

(72) Inventors: Shinji Kubota, Miyagi (JP); Yuji Aota, Miyagi (JP); Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/009,846

(22) Filed: Sep. 2, 2020

(65) Prior Publication Data
US 2021/0066040 A1 Mar. 4, 2021

(30) Foreign Application Priority Data

Sep. 2, 2019 (JP) .............................. JP2019-159853

(51) Int. Cl.
*H01L 21/00* (2006.01)
*H01J 37/32* (2006.01)
*H01L 21/67* (2006.01)

(52) U.S. Cl.
CPC .... *H01J 37/3299* (2013.01); *H01J 37/32091* (2013.01); *H01J 37/32137* (2013.01); *H01J 37/32532* (2013.01); *H01L 21/67069* (2013.01); *H01J 37/32183* (2013.01); *H01J 2237/334* (2013.01)

(58) Field of Classification Search
None
See application file for complete search history.

(56) References Cited

U.S. PATENT DOCUMENTS

| 5,779,925 | A | * | 7/1998 | Hashimoto | ....... | H01J 37/32137 438/758 |
| 2009/0000946 | A1 | * | 1/2009 | Singh | ..................... | C23C 14/345 204/298.01 |
| 2010/0130018 | A1 | * | 5/2010 | Tokashiki | ......... | H01J 37/32082 156/345.48 |
| 2010/0243607 | A1 | * | 9/2010 | Ohse | ................. | H01J 37/32146 156/345.28 |
| 2014/0009073 | A1 | * | 1/2014 | Valcore, Jr. | ............ | H01J 37/244 315/183 |

(Continued)

FOREIGN PATENT DOCUMENTS

JP H10-064915 A 3/1998

*Primary Examiner* — Sylvia Macarthur
*Assistant Examiner* — Michelle Crowell
(74) *Attorney, Agent, or Firm* — Weihrouch IP

(57) ABSTRACT

A plasma processing apparatus includes: a first electrode on which a substrate is placed; a plasma generation source that generates plasma; a bias power supply that supplies bias power to the first electrode; a source power supply that supplies source power to the plasma generation source; and a controller. The controller performs a control such that a first state and a second state of the source power are alternately applied in synchronization with a high frequency cycle of the bias power, or a phase within one cycle of a reference electrical state indicating any one of a voltage, a current and an electromagnetic field measured in a power feed system of the bias power, and performs a control to turn OFF the source power at least at a negative side peak of the phase within one cycle of the reference electrical state.

15 Claims, 26 Drawing Sheets

(56) References Cited

U.S. PATENT DOCUMENTS

| | | | |
|---|---|---|---|
| 2014/0305905 A1* | 10/2014 | Yamada | H01J 37/32568 |
| | | | 156/345.28 |
| 2015/0000841 A1* | 1/2015 | Yamada | H01J 37/32183 |
| | | | 156/345.28 |
| 2015/0122420 A1* | 5/2015 | Konno | H01J 37/32935 |
| | | | 156/345.28 |
| 2016/0079037 A1* | 3/2016 | Hirano | H01J 37/32183 |
| | | | 156/345.28 |
| 2016/0247666 A1* | 8/2016 | Urakawa | H01J 37/32715 |
| 2018/0366335 A1* | 12/2018 | Tanaka | H01L 21/31116 |
| 2020/0411286 A1* | 12/2020 | Koshimizu | H01J 37/32697 |

* cited by examiner

PLASMA PROCESSING APPARATUS AND PROCESSING METHOD

CROSS-REFERENCE TO RELATED APPLICATIONS

This application is based on and claims priority from Japanese Patent Application No. 2019-159853, filed on Sep. 2, 2019, with the Japan Patent Office, the disclosure of which is incorporated herein in its entirety by reference.

TECHNICAL FIELD

The present disclosure relates to a plasma processing apparatus and a processing method.

BACKGROUND

There is known a technology of making the etching rate of a polycrystalline silicon layer uniform, in which a radio-frequency power for drawing applied ions is applied in synchronization with ON/OFF of a radio-frequency power for generating plasma during an etching, so as to cause the ions to reach a polycrystalline silicon layer (see e.g., Japanese Patent Laid-Open Publication No. 10-064915).

SUMMARY

According to one aspect of the present disclosure, there is provided a plasma processing apparatus including: a first electrode on which a substrate is placed; a plasma generation source that generates plasma; a bias power supply that supplies a bias power to the first electrode; a source power supply that supplies a source power having a higher frequency than the bias power, to the plasma generation source; and a controller that controls the bias power supply and the source power supply. The source power has a first state and a second state. The controller performs a control such that the first state and the second state are alternately applied in synchronization with a signal synchronized with a high frequency cycle of the bias power, or a phase within one cycle of a reference electrical state indicating any one of a voltage, a current and an electromagnetic field measured in a power feed system of the bias power, and performs a control to turn OFF the source power at least at a negative side peak of the phase within one cycle of the reference electrical state.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
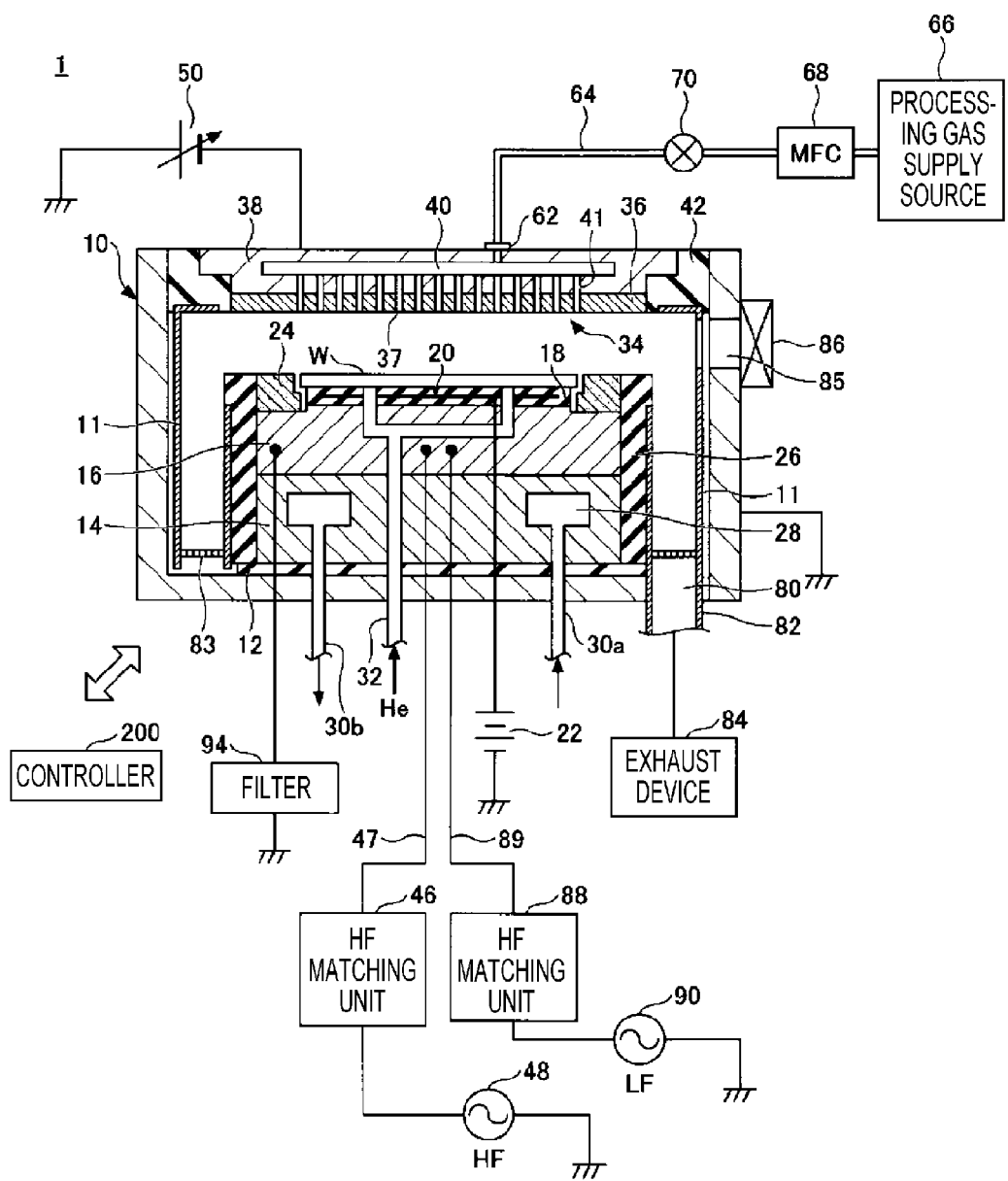
FIG. 1 is a view illustrating an example of a plasma processing apparatus according to an embodiment.

In the following detailed description, reference is made to the accompanying drawings which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the present disclosure will be described with reference to drawings. In the drawings, the same constitutive parts are denoted by the same reference numerals, and redundant descriptions thereof may be omitted.

Hereinafter, the frequency (high frequency) of source power is also referred to as "HF" (High Frequency), and the source power is also referred to as "HF power." The frequency (low frequency) of bias power, which is lower than the frequency of the source power, is also referred to as "LF" (Low Frequency), and the bias power is also referred to as "LF power."

[Entire Configuration of Plasma Processing Apparatus]

First, descriptions will be made on an example of a plasma processing apparatus 1 according to an embodiment, with reference to FIG. 1. FIG. 1 is a view illustrating an example of the plasma processing apparatus according to the embodiment.

The plasma processing apparatus 1 according to the embodiment is a capacitively-coupled parallel plate-plasma processing apparatus, and has, for example, a cylindrical processing chamber 10 made of aluminum whose surface is anodized. The processing chamber 10 is grounded.

On the bottom of the processing chamber 10, a cylindrical support 14 is disposed via an insulating plate 12 made of, for example, ceramic, and a lower electrode 16 made of, for example, aluminum is provided on the support 14. The lower electrode 16 also functions as a stage, on which a substrate W, which is an example of an object to be processed, is placed via an electrostatic chuck 18.

The electrostatic chuck 18 that attracts and holds the substrate W by an electrostatic force is provided on the top surface of the lower electrode 16. The electrostatic chuck 18 has a structure where an ESC electrode 20 including a conductive film is interposed between a couple of insulating layers or insulating sheets. An ESC DC power supply 22 is connected to the ESC electrode 20. A DC voltage output from the ESC DC power supply 22 is applied to the ESC electrode 20. Accordingly, an electrostatic force such as a Coulomb force is generated, by which the substrate W is attracted and held by the electrostatic chuck 18.

A conductive focus ring 24 made of, for example, silicon is disposed around the substrate W on the lower electrode 16. The focus ring 24 is also called an edge ring. A cylindrical lower electrode cover 26 made of, for example, quartz is provided on the side surfaces of the lower electrode 16 and the support 14.

For example, a coolant chamber 28 is annularly formed inside the support 14. A coolant having a predetermined temperature, for example, a fluorine-based inert liquid, is supplied to the coolant chamber 28 through circulation from a chiller unit provided outside via pipes 30a and 30b. The processing temperature of the substrate W on the lower electrode 16 is controlled by the temperature of the coolant. The coolant is an example of a temperature adjusting medium that is supplied to the pipes 30a and 30b through circulation, and the temperature adjusting medium may not only cool but also heat the lower electrode 16 and the substrate W.

A heat transfer gas, for example, He gas, is supplied between the top surface of the electrostatic chuck 18 and the rear surface of the substrate W from a heat transfer gas supply mechanism via a gas supply line 32.

Above the lower electrode 16, an upper electrode 34 is provided in parallel to the lower electrode 16 while facing the lower electrode 16. A plasma processing space is formed between the upper electrode 34 and the lower electrode 16. The upper electrode 34 forms a surface that faces the substrate W on the lower electrode 16 and is in contact with the plasma processing space, that is, a facing surface.

The upper electrode 34 is supported on the upper portion of the processing chamber 10 via an insulating shield member 42. The upper electrode 34 includes an upper electrode plate 36 that constitutes the surface facing the lower electrode 16 and has a large number of gas discharge holes 37, and an upper electrode support 38 that detachably supports the upper electrode plate 36, and is made of a conductive material, for example, aluminum whose surface is anodized. The upper electrode plate 36 may be formed of, for example, silicon or SiC. A gas diffusion chamber 40 is formed inside the upper electrode support 38, and a large number of gas through holes 41 communicating with the gas discharge holes 37 extends downwards from the gas diffusion chamber 40.

A gas introducing hole 62 that introduces a processing gas to the gas diffusion chamber 40 is formed in the upper electrode support 38. A gas supply pipe 64 is connected to the gas introducing hole 62, and a processing gas supply source 66 is connected to the gas supply pipe 64. In the gas supply pipe 64, a mass flow controller (MFC) 68 and an open/close valve 70 are provided in order from the upstream side. Then, a processing gas for etching is supplied from the processing gas supply source 66. The processing gas reaches from the gas supply pipe 64 to the gas diffusion chamber 40, and is discharged to the plasma processing space in a shower form from the gas discharge holes 37 through the gas through holes 41. In this manner, the upper electrode 34 functions as a shower head that supplies the processing gas.

A variable voltage-type DC power supply 50 is connected to the upper electrode 34, and a DC voltage is applied from the variable voltage-type DC power supply 50 to the upper electrode 34. The polarity and current•voltage of the variable voltage-type DC power supply 50, and an electronic switch that turns ON/OFF the current or voltage are controlled by a controller 200.

A radio-frequency power supply 48 is connected to the lower electrode 16 via a power feed rod 47 and a HF matching unit 46. The radio-frequency power supply 48 applies HF power to the lower electrode 16. A low frequency power supply 90 is connected to the lower electrode 16 via a power feed rod 89 and a LF matching unit 88. The low frequency power supply 90 applies LF power to the lower electrode 16. Accordingly, ions are drawn into the substrate W on the lower electrode 16. The frequency of the HF is 13.56 MHz or more. The frequency of the LF is lower than the frequency of the HF, and falls within a range of 200 kHz to 13.56 MHz. For example, HF power of 40 MHz may be output with respect to LF power of 400 kHz. The HF matching unit 46 matches a load impedance to an internal impedance of the radio-frequency power supply 48. The LF matching unit 88 matches a load impedance to an internal impedance of the low frequency power supply 90. A filter 94 that passes a predetermined radio frequency to the ground may be connected to the lower electrode 16. The HF power supplied from the radio-frequency power supply 48 may be applied to the upper electrode 34.

An exhaust port 80 is formed on the bottom of the processing chamber 10, and an exhaust device 84 is connected to the exhaust port 80 via an exhaust pipe 82. The exhaust device 84 has a vacuum pump such as a turbo molecular pump, and is capable of depressurizing the inside of the processing chamber 10 to a desired degree of vacuum. A loading/unloading port 85 for the substrate W is formed in the side wall of the processing chamber 10, and the loading/unloading port 85 can be opened and closed by a gate valve 86. A deposition shield 11 is detachably provided along the inner wall of the processing chamber 10 so as to prevent etching by-product (deposition) from adhering to the processing chamber 10. That is, the deposition shield 11 constitutes the wall of the processing chamber. The deposition shield 11 is also provided on the outer periphery of the lower electrode cover 26. An exhaust plate 83 is provided between the deposition shield 11 on the wall side of the processing chamber and the deposition shield 11 on the lower electrode cover 26 side, on the bottom of the processing chamber 10. As for the deposition shield 11 and the exhaust plate 83, an aluminum material coated with ceramic such as $Y_2O_3$ may be used.

When an etching processing is performed in the plasma processing apparatus 1 as configured above, first, the gate valve 86 is opened so that the substrate W is loaded into the processing chamber 10 through the loading/unloading port 85, and is placed on the lower electrode 16. Then, a processing gas for etching is supplied at a predetermined flow rate from the processing gas supply source 66 to the gas diffusion chamber 40, and is supplied into the processing chamber 10 through the gas through holes 41 and the gas discharge holes 37. The inside of the processing chamber 10 is exhausted by the exhaust device 84, and the pressure therein is set to a set value within a range of, for example, 0.1 Pa to 150 Pa. As for the processing gas, various gases, which have been conventionally used, may be employed, and a gas containing a perfluorocarbon element such as, for example, $C_4F_8$ gas may be properly used. Other gases such as Ar gas or $O_2$ gas may be contained.

In a state where the etching gas is introduced into the processing chamber 10 as described above, HF power is applied to the lower electrode 16 from the radio-frequency power supply 48. LF power is applied to the lower electrode 16 from the low frequency power supply 90. A DC voltage is applied to the upper electrode 34 from the variable voltage-type DC power supply 50. A DC voltage is applied to the ESC electrode 20 from the ESC DC power supply 22 so that the substrate W is attracted and held by the lower electrode 16.

The processing gas discharged from the gas discharge holes 37 of the upper electrode 34 is dissociated and ionized mainly by HF power to generate plasma. The processing target surface of the substrate W is etched by radicals or ions in the plasma. By application of LF power to the lower electrode 16, ions in the plasma are controlled to enable etching of holes with a high aspect ratio. Thus, the control margin of the plasma may be widened.

[Controller]

The plasma processing apparatus 1 is provided with the controller 200 that controls the operations of the entire apparatus. The controller 200 executes a desired plasma processing such as etching according to a recipe stored in a memory such as a read only memory (ROM) or a random access memory (RAM). In the recipe, device control information related to process conditions, that is, for example, a process time, a pressure (gas exhaust), a radio frequency power or voltage, various gas flow rates, a temperature within a processing chamber, and a temperature of a coolant output from a chiller, is set. The recipe indicating these programs or process conditions may be stored in a hard disk or a semiconductor memory. The recipe may be set and read at a predetermined location while being accommodated in a portable computer-readable storage medium such as a CD-ROM or a DVD.

ON/OFF or High/Low of HF power may be controlled to be synchronized with a signal synchronized with a high frequency cycle of bias power, or a phase within one cycle of any one of a voltage, a current and an electromagnetic field measured in a power feed system of bias power. For example, the controller 200 may perform controlling such that ON/OFF or High/Low of the HF power is synchronized with a phase within one cycle of the voltage or the current of the LF. Accordingly, the quantity and the quality of ions and radicals may be controlled. Further, an occurrence of IMD may be reduced.

The power feed system of the bias power refers to the low frequency power supply 90→the LF matching unit 88→the power feed rod 89→the lower electrode 16→(plasma)→the upper electrode 34→(ground). Any one of the voltage, the current and the electromagnetic field measured in the power feed system of the bias power refers to a voltage, a current or an electromagnetic field measured on parts from the low frequency power supply 90 to the lower electrode 16 via the inside of the LF matching unit 88 and the power feed rod 89, and on the upper electrode 34.

The state of the signal synchronized with the high frequency cycle of the bias power, or any one of the voltage, the current and the electromagnetic field measured in the power feed system of the bias power is also called a "reference electrical state." The HF power (source power) is controlled to be alternately applied as a first state and a second state to be described below in synchronization with the phase within one cycle of the reference electrical state.

When the voltage, the current or the electromagnetic field measured in the power feed system of the bias power is set as the "reference electrical state," it is desirable that the reference electrical state is a voltage, a current or an electromagnetic field that is measured in any one of members from the lower electrode 16 to the inside of the matching unit connected via the power feed rod 47.

As a method of measuring the reference electrical state in the power feed system of the bias power, there is a method of providing a voltage probe, a current probe, and a BZ probe (a probe that measures an induced magnetic field) near any one of parts in the power feed system of the bias power. Accordingly, the voltage, the current or the induced magnetic field of each part is measured by each probe.

Figure 2:
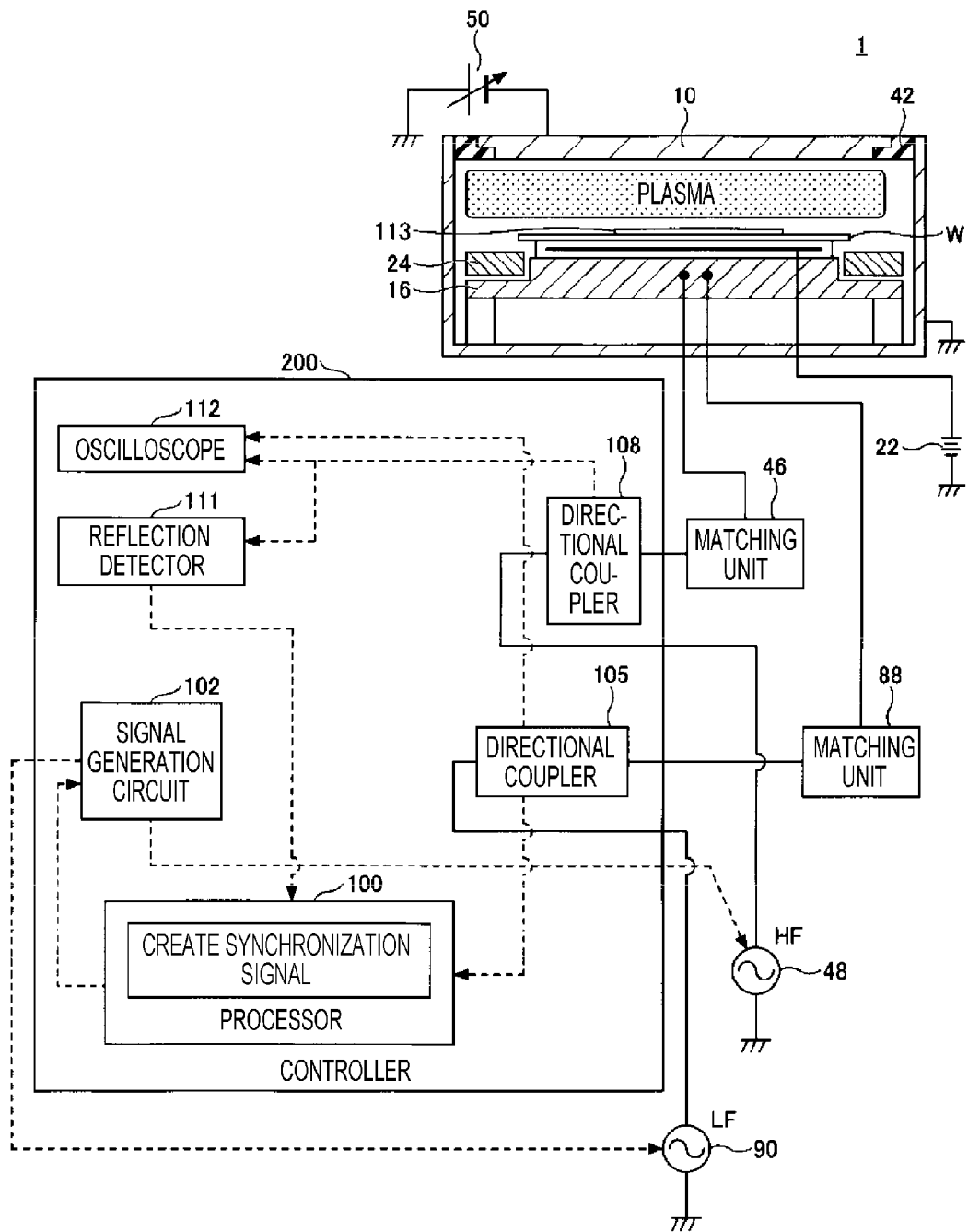
FIG. 2 is a view illustrating a case of a control by a phase signal of a sensor attached to a power feed system according to the embodiment, or a case of a control by a signal synchronized with a high frequency cycle of bias power.
Figure 3A:
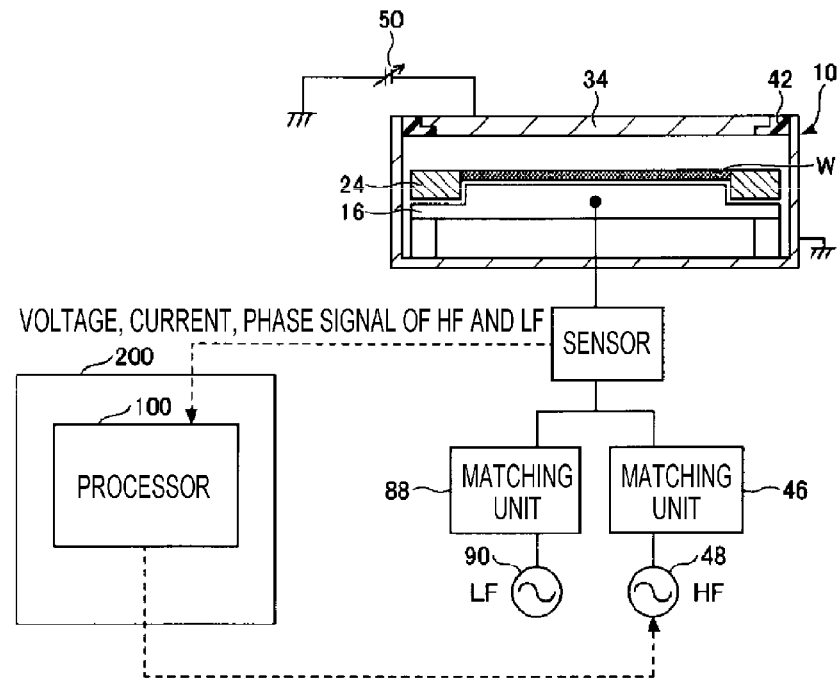
FIGS. 3A and 3B are views illustrating an example of a configuration of a controller according to the embodiment.

For example, FIG. 2 is an example of a case where any one of the voltage, the current and the electromagnetic field measured in the power feed system of the bias power is set as a "reference electrical state." For example, in FIG. 3A, a processor 100 inputs any one of the voltage or current of the HF, the voltage or current of the LF, and an HF phase signal or an LF phase signal, from a sensor such as a VI probe attached to the power feed system. The processor 100 alternately applies source power as a first state and a second state in synchronization with the phase within one cycle of the reference electrical state indicating any one of the voltage or current of the HF, the voltage or current of the LF, and the HF phase signal or the LF phase signal, which has been input.

Figure 3B:
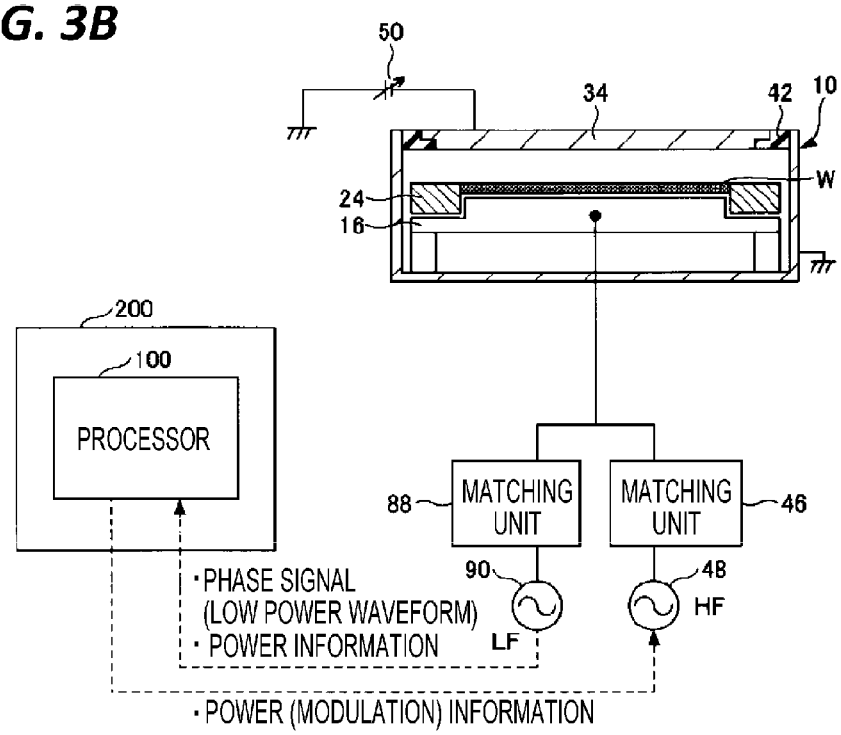

The processor 100 may not rely on the signal from the sensor, but generate a signal synchronized with the high frequency cycle of bias power output from the low frequency power supply 90. In this case, the state of the signal may be set as a reference electrical state. It is possible to omit the step of measuring the reference electrical state in the power feed system of the bias power. For example, in FIG. 3B, the processor 100 inputs a signal related to a LF phase signal (low power waveform) or bias power information, from the low frequency power supply 90, and generates a signal synchronized with the high frequency cycle of the bias power, on the basis of the input signal. The processor 100 outputs the generated signal to the radio-frequency power supply 48. The radio-frequency power supply 48 alternately applies the source power as the first state and the second state, on the basis of the signal.

The processor 100 may not rely on the signal from the low frequency power supply 90, but generate a signal synchronized with a low frequency cycle of the bias power. In this case, the processor 100 generates, for example, a signal having a cycle indicated by LF in FIG. 2, and in synchronization with this signal, generates, for example, an ON/OFF signal indicated by HF in FIG. 2. The processor 100 outputs the generated signal to the low frequency power supply 90 and the radio-frequency power supply 48. The low frequency power supply 90 outputs the bias power on the basis of this signal. The radio-frequency power supply 48 alternately applies the source power as the first state and the second state on the basis of this signal. That is, when the first state and the second state are alternately applied in synchronization with the signal synchronized with the low frequency cycle of the bias power, the signal may be a signal that is generated without relying on the signal from the low frequency power supply 90, and synchronized with the low frequency cycle of the bias power.

The lower electrode 16 is an example of a first electrode on which the substrate W is placed. The upper electrode is an example of a second electrode facing the first electrode. The low frequency power supply 90 is an example of a bias power supply that supplies LF power to the first electrode. The radio-frequency power supply 48 is an example of a source power supply that supplies HF power having a higher frequency than the LF power, to the first electrode or the second electrode. The controller 200 is an example of a controller that controls the bias power supply and the source power supply. The potential of the lower electrode 16 to which the bias power is applied is also called a lower electrode potential.

[Configuration of Controller]

Descriptions will be made on a specific configuration of the controller 200, with reference to FIG. 2. FIG. 2 is a view illustrating an example of the configuration of the controller 200 according to the embodiment. The controller 200 includes the processor 100, a signal generation circuit 102, directional couplers 105 and 108, a reflection detector 111, and an oscilloscope 112.

In the power supply line of the radio-frequency power supply 48, the directional coupler 108 is connected between the frequency power supply 48 and the HF matching unit 46. In the power supply line of the low frequency power supply 90, the directional coupler 105 is connected between the low frequency power supply 90 and the LF matching unit 88.

The directional coupler 108 gives a part of traveling wave power (hereinafter, also referred to as "Pf") and reflection wave power (hereinafter, also referred to as "Pr") of the HF to the oscilloscope 112. The directional coupler 105 gives a part of traveling wave power of the LF to the oscilloscope 112.

Figure 5:
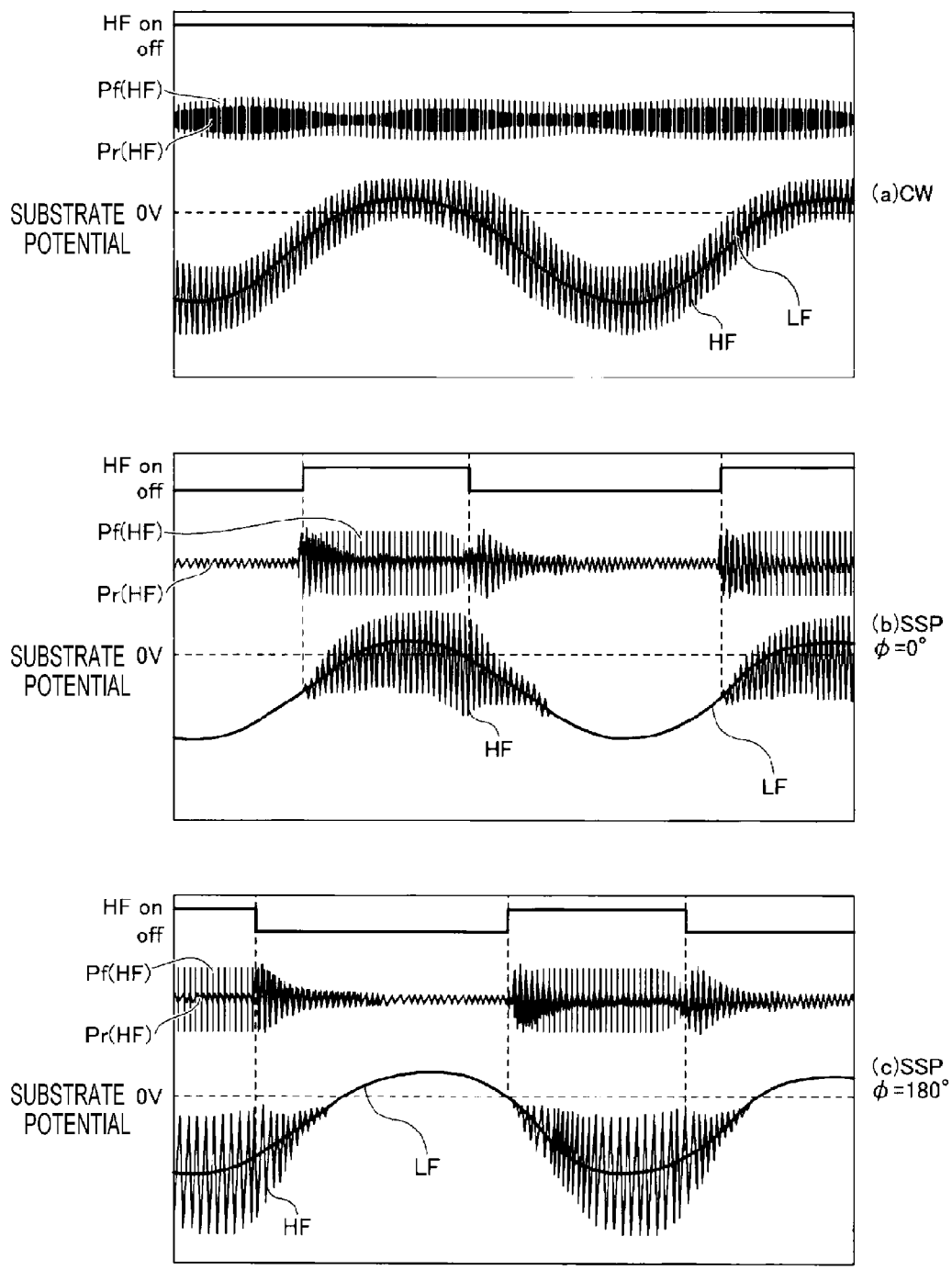
FIG. 5 is a view illustrating waveforms of LF and HF voltages used in Example 1 of the embodiment.

In the embodiment, the LF frequency displayed on the oscilloscope 112 is, for example, 400 kHz, and the HF frequency is, for example, 40 MHz. Accordingly, in the oscilloscope 112, the waveform of the traveling wave power of the LF, the waveform of the traveling wave power of the HF, and the waveform of the reflection wave power of the HF may be observed. For example, FIG. 5 illustrates an example of the waveform of the traveling wave power of the HF (Pf(HF)) and the waveform of the reflection wave power of the HF (Pr(HF)).

The directional coupler 108 separates a predetermined proportion of the reflection wave of the HF, and gives the proportion to the reflection detector 111. The reflection detector 111 includes, for example, a spectrum analyzer, and a power meter, and measures how many intermodulation distortions (IMD) of what wavelengths are occurring or the degree of the reflection wave power. The IMD refers to the reflection wave power from the plasma side, which is generated according to the frequency of the sum or difference between the fundamental wave and/or the harmonic wave of the LF, and the fundamental wave and/or the harmonic wave of the HF, which is generated when HF power is applied to the upper electrode or the lower electrode of the plasma processing apparatus 1, and LF power is applied to the lower electrode.

The directional coupler 105 gives a part of the traveling wave power of the LF to the processor 100. The processor 100 creates a HF synchronization signal that is to be synchronized with the traveling wave power of the LF. For example, the processor 100 may create the HF synchronization signal in synchronization with the positive timing of the traveling wave of the LF. The waveform of the LF detected by using a sensor such as a VI probe, instead of the directional coupler 105, may be given to the processor 100.

The processor 100 gives the created synchronization signal to the signal generation circuit 102. The signal generation circuit 102 generates a control signal synchronized with the traveling wave power of the LF from the given synchronization signal, and gives the control signal to the radio-frequency power supply 48 and the low frequency power supply 90.

The method of generating a control signal includes the following two methods. When the low frequency power supply 90 is a general power supply, the directional coupler 105 extracts a part of the voltage or the current of the LF output from the low frequency power supply 90, as a waveform, and inputs the part to the processor 100. However, the present disclosure is not limited thereto. The processor 100 may directly input a part of, for example, the LF power from the low frequency power supply 90, and may generate a signal that controls the radio-frequency power supply 48 and the low frequency power supply 90 without relying on the signal from the low frequency power supply 90. The processor 100 creates an ON signal having an arbitrary delay and an arbitrary width from the input waveform signal or the generated signal, and transmits the ON signal to the signal generation circuit 102. The ON signal is an example of a synchronization signal.

The signal generation circuit 102 sends a command signal to the radio-frequency power supply 48 in order to generate the HF power during the ON signal. As the command signal, a control signal for generating the HF power or the ON signal itself is used, during the ON signal, according to the input form of the radio-frequency power supply 48.

When the low frequency power supply 90 is an amplifier that amplifies the LF power, the voltage or the current, the signal from the directional coupler 105 may not be used. In this case, the signal generation circuit 102 may extract a part of, for example, the LF power output from the low frequency power supply 90, as a waveform, and create an ON signal having an arbitrary delay and an arbitrary width from the waveform signal. The signal generation circuit 102 transmits the waveform signal and the ON signal to the radio-frequency power supply 48.

Meanwhile, the above described method of generating a control signal is an example. The present disclosure is not limited thereto as long as from the given synchronization signal, it is possible to generate a control signal that performs a control to alternately apply ON/OFF or High/Low of the HF power in synchronization with a phase within one cycle of a reference electrical state (for example, a phase within one cycle of an LF voltage or current, or an electrode potential). As long as it is possible to generate the control signal in this manner, the present disclosure is not limited to the circuit of the controller 200 illustrated in FIG. 2, and other hardware or software may be used.

The amplifier of the low frequency power supply 90 amplifies the amplitude (AM: amplitude modulation) of an LF modulation signal of 400 kHz, and supplies the amplified amplitude to the lower electrode. The amplifier of the radio-frequency power supply 48 amplifies the amplitude of an HF modulation signal of 40 MHz, and supplies the amplified amplitude to the lower electrode.

[Tilting]

Figure 4:
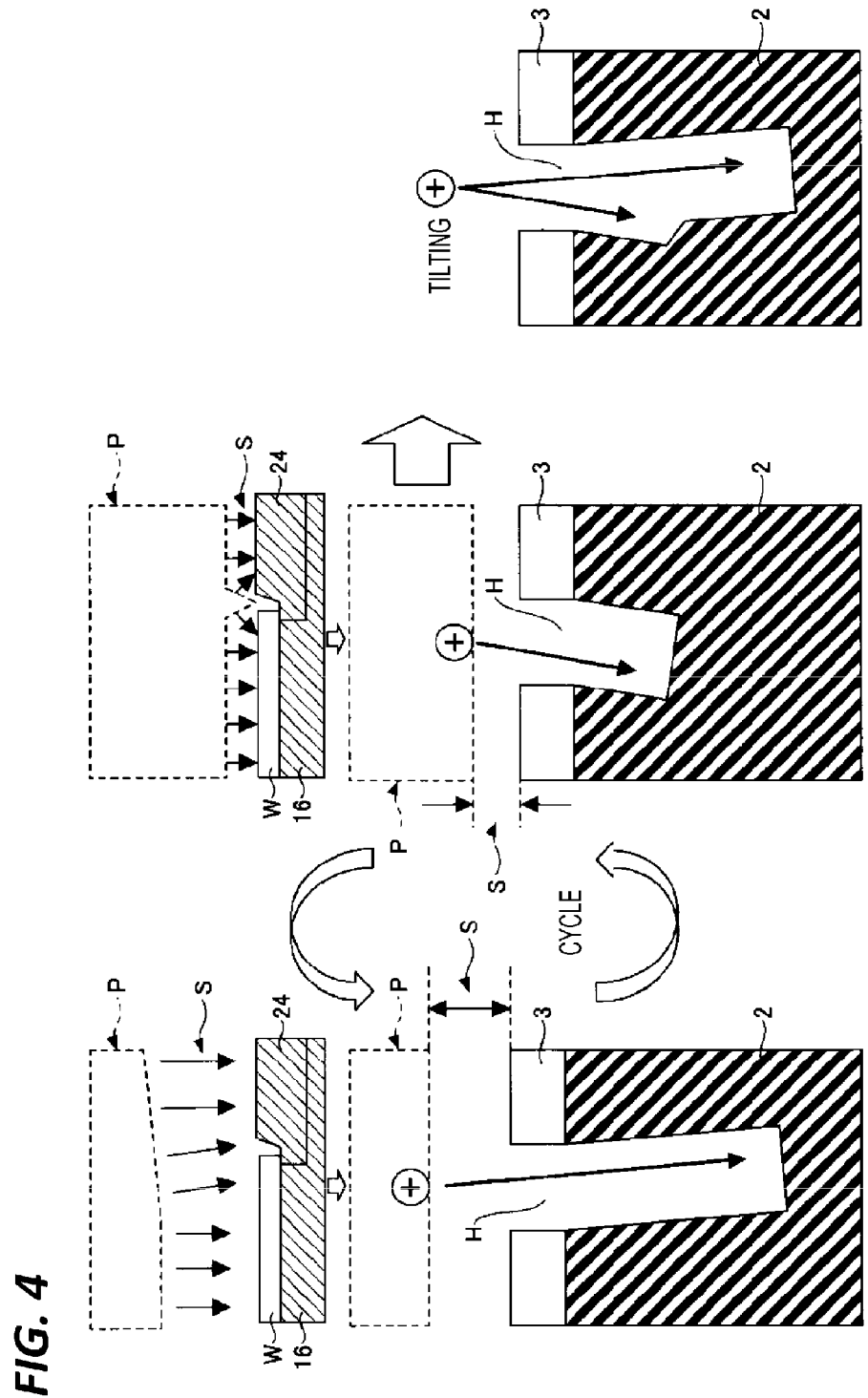
FIG. 4 is a view for explaining the occurrence of tilting.

Tilting may occur when an etching target film is etched. FIG. 4 is a view for explaining the occurrence of tilting. In the plasma processing apparatus 1 according to the embodiment, bias power (LF power) and source power (HF power) are applied to the lower electrode 16. When the voltage of the LF is negative by the self-bias voltage (Vdc) and the substrate potential (electrode potential) is negatively deepened, since the thickness of the sheath is proportional to the voltage, at the negative substrate potential, a large voltage is applied to the substrate, and the thickness of the sheath increases. In contrast, when the substrate potential is positive, electrons are accelerated toward the substrate. Since electrons have a smaller mass and a very higher mobility than ions, a large current flows toward the substrate, and the positive potential is alleviated. Thus, the potential of the substrate does not increase in the positive direction, and the sheath thickness also does not increase.

The thickness of the sheath changes substantially by the plasma density distribution. For example, it is assumed that the same potential was applied to the substrate W. When a case where the plasma density distribution is biased is assumed, the sheath becomes thin at a place where the plasma density is high, and conversely, the sheath becomes thick at a place where the plasma density is low. As described above, when the plasma density distribution is biased, the interface of the sheath is inclined toward the substrate W, and ions are also accelerated in the oblique direction.

FIG. 4 illustrates an example when an etching target film 2 such as a silicon oxide film ($SiO_2$) is etched into a hole pattern of a mask 3. In this example, when a sheath S is thick, ions enter the edge region of the substrate W while being inclined to one side. Accordingly, inclination occurs in the etching shape of the hole H formed in the etching target film 2. When the sheath S becomes thin, since the sheath S varies according to a gap between the substrate W and the focus ring 24, the incident angle of ions varies. Accordingly, inclination occurs in the etching shape of the hole H formed in the etching target film 2, which is different from that when the sheath S is thick. Such a variation of the incident angle of ions is repeated according to the cycle of an LF voltage. Such an occurrence of inclination in the etching shape is called tilting, and an etching shape in which inclination has occurred is also called a tilting shape. FIG. 4 is an example, and the tilting shape is not limited thereto. The tilting shape also includes a case where inclination occurs in a groove as well as a hole.

In order to suppress such tilting, the embodiment provides the plasma processing apparatus 1 and a processing method, in which it is possible to control the ion energy distribution and the in-plane distribution of a plasma density. This makes it possible to control the incident angle of ions on the substrate W so that the occurrence of a tilting shape is suppressed, and the shape of, for example, a hole is vertically formed.

Hereinafter, descriptions will be made on measurement results when a silicon oxide film is etched under various process conditions by using the plasma processing apparatus 1 according to the embodiment. In Example 1 and other Examples, as illustrated in FIG. 2, an ion energy analyzer (IEA) measurement device 113 was placed on the substrate W, and a probe was brought into contact with the substrate W so as to measure ion energy that reached the substrate W. The IEA measurement device 113 is disposed on the substrate W only when the substrate potential is measured, and is not disposed during other processings. In each of Examples to be described below, "IEDF" indicates a measurement result by the IEA measurement device 113, and indicates the number of ions that have energy values, respectively, and have reached the substrate W. Regarding the in-plane distribution of the plasma density, a plasma absorption probe (PAP) was used to measure the electron density.

Example 1

Figure 6:
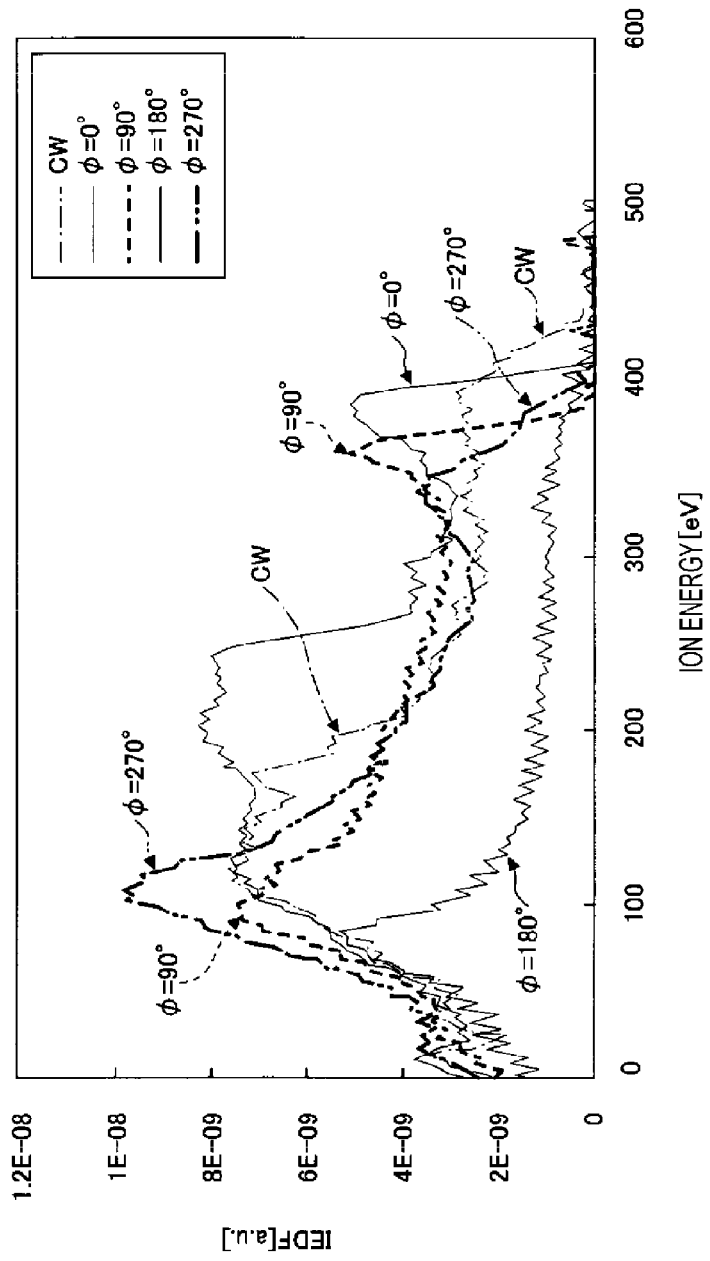
FIG. 6 is a view illustrating an example of the measurement result of the ion energy distributions at the HF pulse application timings of FIG. 5.

First, descriptions will be made on Example 1 of the embodiment, with reference to FIGS. 5 and 6. FIG. 5 is a view illustrating waveforms of an LF voltage (also simply referred to as an LF) and an HF voltage (also simply referred to as an HF) used in Example 1 of the embodiment, and illustrating application timings of an HF pulse. FIG. 6 is a view illustrating an example of the measurement result of the ion energy distributions at the HF pulse application timings of FIG. 5.

In FIG. 5, (a) illustrates application of an HF according to Comparative Example. In Comparative Example illustrated in (a) of FIG. 5, since the HF is always turned ON, the traveling wave (Pf) and the reflection wave (Pr) of the HF are always output. Hereinafter, "CW" indicates that the HF is continuously applied. Hereinafter, in all Examples and modification, "CW" is illustrated for Comparative Example.

In FIG. 5, (b) and (c) illustrate application timings of an HF pulse according to Example 1 of the embodiment. In all Examples of the embodiment and modification to be described, the controller 200 performs an "SSP" control in which source power is intermittently applied at a predetermined timing in synchronization with a high frequency cycle of bias power. That is, since the HF pulse is introduced in synchronization with the movement of the sheath, a sheath synchronized pulse is referred to as "SSP" as an abbreviation. In Example 1 illustrated in (b) an (c) of FIG. 5, the source power is turned ON at a Duty ratio of 40%. The reflection wave (Pr) of the HF is generated at a timing when the traveling wave (Pf) is turned ON and at a timing when the traveling wave (Pf) is turned OFF. Even when the HF power is turned OFF, a large reflection wave is generated for a while, and then is gradually attenuated.

In the "SSP" control, a timing when source power is applied in synchronization with bias power is illustrated by φ (phase). SSP (φ=180°) in (c) of FIG. 5 indicates a case where the center of a pulse indicating the timing during which the source power is turned ON is equal to the LF as the maximum negative value. SSP (φ=0°) in (b) of FIG. 5 indicates a case where the center of a pulse indicating the timing during which the source power is turned ON is equal to the LF as the maximum positive value.

SSP (φ=90°) indicates a case where the center of a pulse indicating the timing during which the source power is turned ON is equal to the LF changing from positive to negative. SSP (φ=270°) indicates a case where the center of a pulse indicating the timing during which the source power is turned ON is equal to the LF changing from negative to positive.

Process conditions in Example 1 are as follows.
<Process Conditions>

| Gas | Argon (Ar) |
|---|---|
| Pressure | 20 mTorr (2.67 Pa) |
| LF | 50 W |
| HF | 100 W (Duty ratio 40%) |

FIG. 6 illustrates the measurement result of the distribution of ion energy that reached the substrate, which was measured by the IEA measurement device 113, when plasma was generated in the plasma processing apparatus 1 under the above process conditions. The horizontal axis in FIG. 6 indicates ion energy, and the vertical axis indicates an ion energy distribution function (IEDF), that is, a distribution function of ions that reached the substrate at the corresponding ion energy. The integrated value of the IEDF at each ion energy value is the total number of ions that reached the wafer.

It is desirable that the ion energy distribution generally has two peaks on the low energy side (around 100 eV) and the high energy side (around 350 eV to 400 eV), and the number of ions having intermediate ion energy is small. In "CW" (see (a) of FIG. 5) indicating Comparative Example, in the ion energy distribution, a broad peak is seen on the low energy side (100 Ev to 150 eV), and no peak is seen near the high energy side (350 Ev to 400 eV).

Next, regarding "SSP" indicating the embodiment, as a result of ion energy distribution measurement at φ=0° (see (b) of FIG. 5), φ=180° (see (c) of FIG. 5), φ=90°, and φ=270°, at φ=0°, and 90°, clear peaks are seen on the high energy side (around 350 eV to 400 eV). Meanwhile, at φ=180° and 270°, peaks are hardly seen on the high energy side, and the maximum value of the ion energy distribution is shifted to the low energy side. At φ=180°, the amount of ions that reached the substrate was significantly reduced. In a desirable ion energy distribution, a higher and clearer peak is seen on the high energy side, and a clear peak is seen on the low energy side as well. In this case, at φ=90° and 270°, the best ion energy distributions are illustrated. As described above, in the embodiment, it is possible to control the ion energy distribution and the peak and the amount on the high energy side, by controlling the phase of the SSP.

According to the results in Example 1, in the processing method according to the embodiment, the timing and conditions for applying the HF in pulses are properly controlled according to the movement of a sheath (that is, a cycle of the LF) so as to control the ion energy reaching the substrate. For this purpose, further experiments were performed on proper values for a HF pulse application timing and other conditions, such as optimization of the phase (φ).

Example 2

Next, Example 2 of the embodiment will be described with reference to FIGS. 7A and 7B. Process conditions in Example 2 are as follows.
<Process Conditions>

| Gas | Argon |
|---|---|
| Pressure | 20 mTorr |
| LF | 50 W |
| HF | Power variable (average value), Duty = 40% |

Figure 7A:
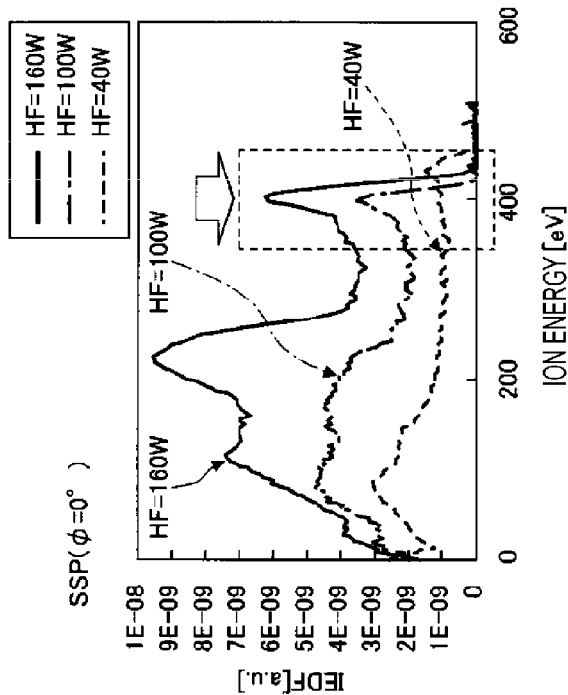
FIGS. 7A and 7B are views illustrating the source power dependence of the ion energy distributions according to Example 2 of the embodiment.
Figure 7B:
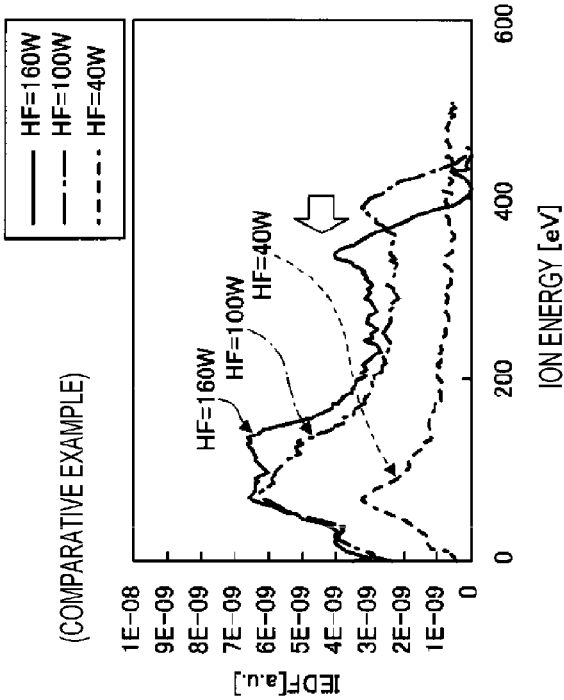

FIGS. 7A and 7B illustrate the measurement result of the distributions of ion energy that reached the substrate when plasma was generated in the plasma processing apparatus 1 under the above process conditions. Descriptions will be made on the source power dependence of the ion energy distribution, by using FIGS. 7A and 7B.

FIG. 7A illustrates the source power dependence of the ion energy distribution in the case of "CW" indicating Comparative Example, and FIG. 7B illustrates the source power dependence of the ion energy distribution in the case of SSP (φ=0°) indicating Example 2 of the embodiment.

In the case of "CW" of Comparative Example, the source power was increased (40 W→100 W→160 W). As a result, as the source power increases, the peak amount on the high energy side increases, but the ion energy value itself on the high energy side is shifted to the low energy side. This is because as the source power increases, the plasma electron density (Ne) increases so that a potential difference between the plasma potential and the substrate is reduced. Accordingly, it is thought that the energy of accelerated ions was decreased, and the ion energy distribution was shifted to the low energy side. From the above, in the case of "CW," it is difficult to independently control the ion energy, and the plasma electron density (Ne) proportional to the amount of ions.

In contrast, in the case of SSP (φ=0°) in FIG. 7B, as the HF power increased (40 W→100 W→160 W), the peak amount of ions on the high energy side increased. Further, a phenomenon that the ion energy distribution is shifted to the low energy side did not occur, and no reduction of ion energy on the high energy side was observed even if the source power was increased.

This is because at the SSP (φ=0°), plasma is generated while the source power is turned ON, and ions are accelerated by a negatively deeper bias voltage at a timing when the bias power is applied, so that the ion energy increases. This is also because it is thought when the source power is turned OFF, the ion sheath is also collapsing during a plasma disappearing process. Meanwhile, during this time, not so many ions disappear, and thus, ions are accelerated by the energy of the voltage itself applied to the substrate.

From the above, it was found that according to the processing method of the "SSP" according to the embodiment, it is possible to independently control the ion energy, and the amount of ions reaching the substrate by optimizing the phase (φ).

Example 3

Next, descriptions will be made on Example 3 of the embodiment with reference to FIG. 8. Process conditions in Example 3 are as follows. In Example 3 and other Examples, the plasma electron density (Ne) was measured by using a PAP (probe for plasma measurement).

<Process Conditions>

| Gas | Argon |
|---|---|
| Pressure | 20 mTorr |
| LF | 50 W |
| HF | 100 W (average value), Duty = 40% |

Figure 8:
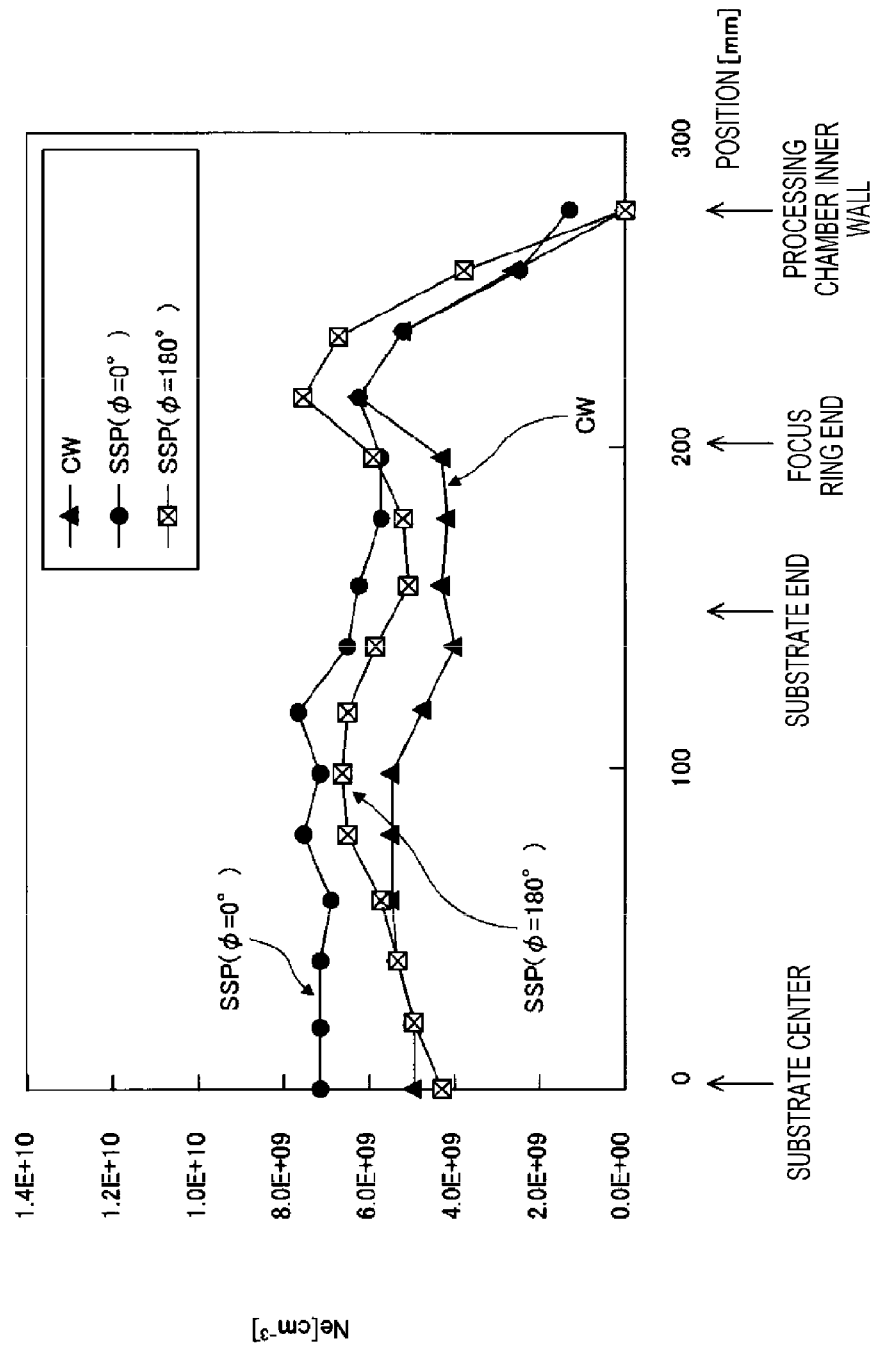
FIG. 8 is a view illustrating the relationship between the type (CW, SSP phase) of the source power and the in-plane distribution of the plasma electron density, according to Example 3 of the embodiment.

FIG. 8 illustrates the measurement result of the plasma electron density (Ne) at each of positions from the center of the substrate to the vicinity of the inner wall of the processing chamber 10, when plasma was generated in the plasma processing apparatus 1 under the above process conditions. Descriptions will be made on the relationship between the type (CW, SSP phase) of the source power and the in-plane distribution of the plasma electron density (Ne), according to the embodiment, by using FIG. 8. On the horizontal axis of FIG. 8, the center of the substrate is set to "0," and thus 0 mm on the horizontal axis is the center of the substrate, 150 mm is the end of the substrate, 200 mm is the vicinity of the end of the focus ring 24, and 280 mm is the vicinity of the inner wall of the processing chamber 10.

In contrast to "CW" of Comparative Example, at the SSP ($\varphi=0°$) of the embodiment, the center of the ON state period of the HF pulse is equal to the time when the LF becomes the maximum positive value. In this case, since a sheath is thin, the source power easily enters the center side of the substrate. Thus, the plasma electron density (Ne) increased on the center side of the substrate. Meanwhile, at the SSP ($\varphi=180°$) of the embodiment, the center of the ON state period of the HF pulse is equal to the time when the LF becomes the maximum negative value. In this case, since a sheath becomes thick, it is difficult for the source power to enter the center side of the substrate, and it is easy for the source power to enter the outside of the focus ring 24. Thus, the plasma electron density (Ne) increased outside the focus ring 24.

From the above, at the SSP ($\varphi=0°$), since the sheath is thin, the plasma electron density (Ne) is highest on the center side of the substrate, while at the SSP ($\varphi=180°$), since the sheath becomes thick, it is difficult for the source power to enter, and the plasma electron density (Ne) decreased on the center side of the substrate. Therefore, it was found that in the SSP control according to the embodiment, the distribution of the plasma electron density (Ne) may be changed by changing the phase ($\varphi$) at which the source power is applied, and then the distribution of the plasma electron density (Ne) in the plane of the substrate may be controlled.

Example 4

Next, descriptions will be made on Example 4 of the embodiment, with reference to FIG. 9. Process conditions in Example 4 are as follows.
<Process Conditions>

| Gas | Argon |
|---|---|
| Pressure | 20 mTorr |
| LF | Variable |
| HF | 100 W (average value), Duty = 40% |

Figure 9:
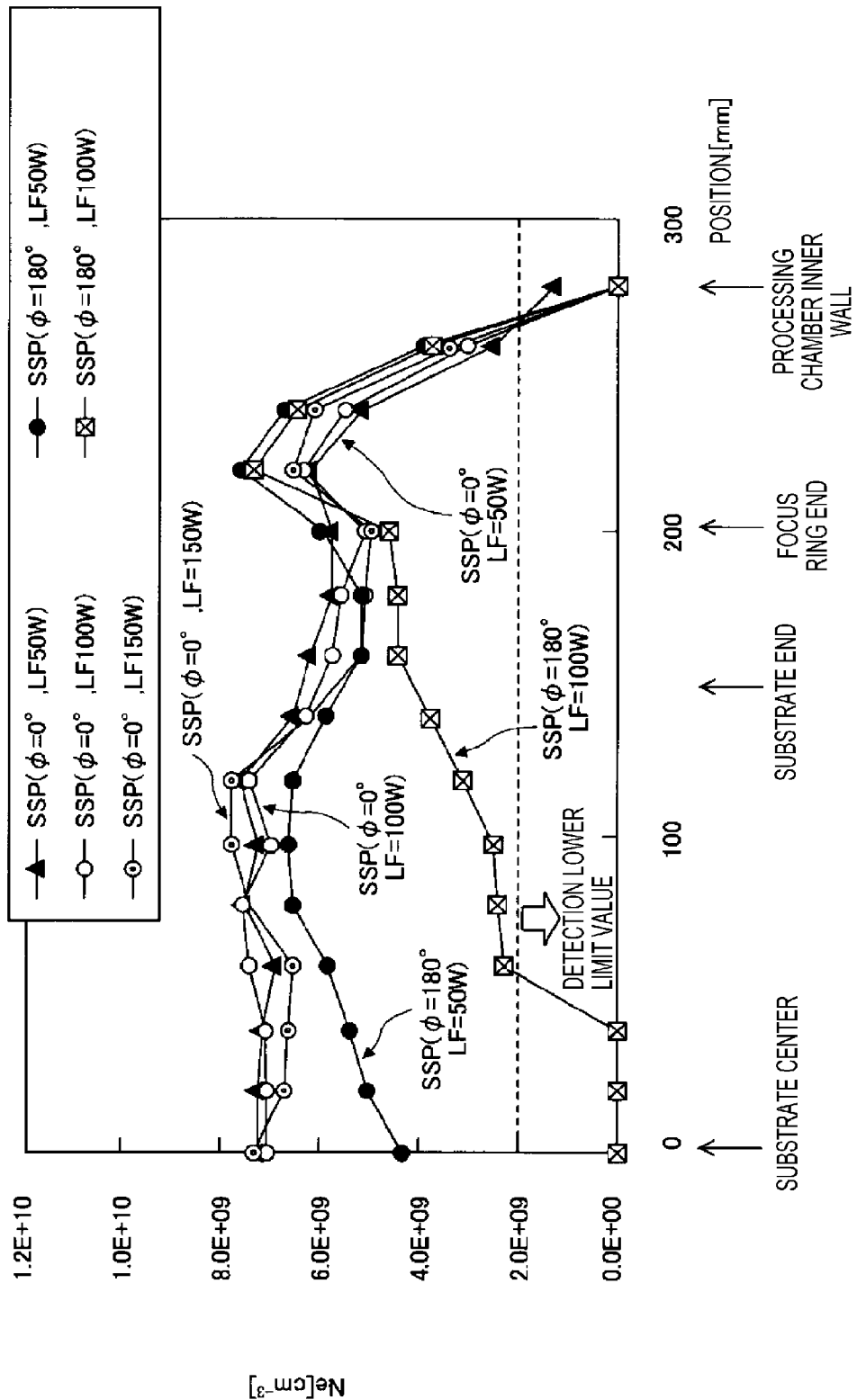
FIG. 9 is a view illustrating an example of the measurement result of the bias power dependence of the in-plane distribution of the plasma electron density, according to Example 4 of the embodiment.

FIG. 9 illustrates an example of the measurement result of the bias power dependence of the in-plane distribution of the plasma electron density (Ne) at each of positions from the center of the substrate to the vicinity of the inner wall of the processing chamber 10 when plasma was generated in the plasma processing apparatus 1 under the above process conditions.

The measurement was performed on the cases of SSP ($\varphi=0°$) and SSP ($\varphi=180°$). In the case of SSP ($\varphi=0°$), measurement was performed on three patterns (50 W, 100 W, and 150 W) of the bias power. In the case of SSP ($\varphi=180°$), measurement was performed on two patterns (50 W and 100 W) of the bias power.

According to the measurement result of FIG. 9, as compared to in the case of SSP ($\varphi=0°$), in the case of SSP ($\varphi=180°$), the plasma electron density (Ne) decreased on the center side of the substrate, and the plasma electron density (Ne) increased outside the focus ring 24. This is because in the case of SSP ($\varphi=180°$), at a timing when the HF pulse is applied, since the LF bias is around the maximum negative value, a sheath is thick, so that it is difficult for the source power to enter the substrate side, and it is easy for the source power to enter the outside of the focus ring 24.

In the case of SSP ($\varphi=0°$), the plasma electron density (Ne) has almost the same distributions in all cases (50 W, 100 W, and 150 W) of the bias power. Therefore, it was found that the in-plane distribution of the plasma electron density (Ne) may be controlled by controlling the timing of the phase ($\varphi$) at which the source power is applied. For example, by controlling the phase ($\varphi$) at which the source power is applied, it is possible to increase the plasma electron density (Ne) on the center side of the substrate, and to increase the plasma electron density (Ne) on the end side of the substrate or on the focus ring 24. Accordingly, an efficient plasma electron density (Ne) may be obtained even if the source power and the bias power have the same average power value.

From the above measurement results of Examples 1 to 4, it was found that at the SSP according to the embodiment, it is better to perform a control to turn OFF the source power at least at the negative side peak of a phase within one cycle of a reference electrical state. That is, SSP ($\varphi=0°$) is preferable to SSP ($\varphi=180°$). Since the plasma electron density (Ne) is proportional to the ion density or the amount of ions, it was found that it is possible to independently control the ion energy and the ion amount by turning OFF the source power through a control at least at the negative side peak of the phase within one cycle of the reference electrical state. Specifically, it was found that it is possible to independently control the ion energy and the ion density by the bias power and the source power, respectively.

Example 5

Figure 10:
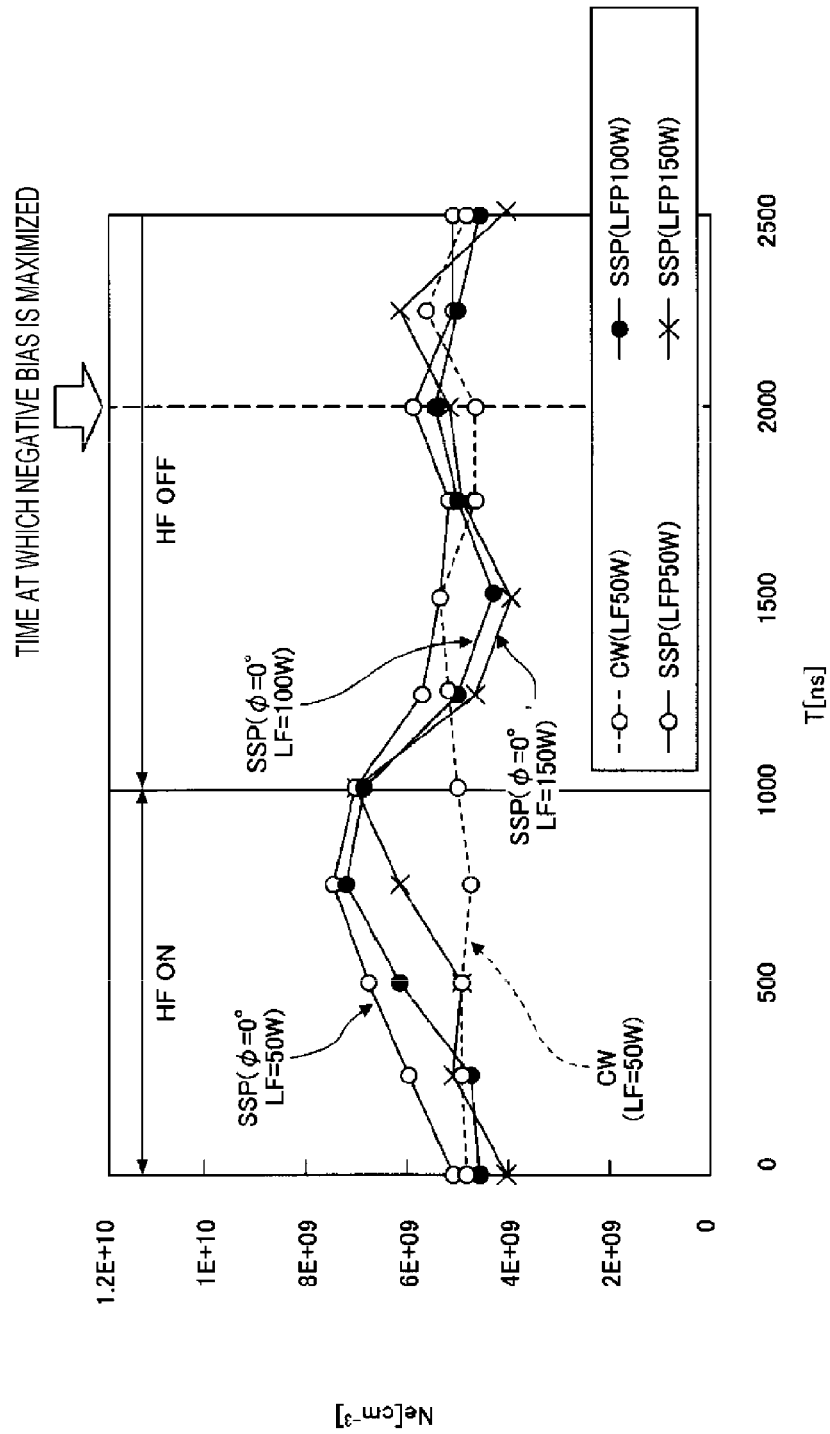
FIG. 10 is a view illustrating the bias power and a temporal change of the plasma electron density according to Example 5 of the embodiment.

Next, descriptions will be made on Example 5 of the embodiment, with reference to FIG. 10. In Example 5, the bias power was changed at the SSP ($\varphi=0°$) at which a control is made to turn OFF the source power at the negative side peak of the LF voltage. FIG. 10 is a view illustrating the bias power and the temporal change of the plasma electron density according to Example 5 of the embodiment. Process conditions in Example 5 are as follows.
<Process Conditions>

| Gas | Argon |
|---|---|
| Pressure | 20 mTorr |
| LF | Variable |
| HF | 100 W (average value), Duty = 40% |

Comparative Example: CW (LF=50 W, HF=Continuous Wave of 100 W)

The effective power of the source power in the "CW" of Comparative Example is the same as the effective power of the source power in the "SSP" (Duty=40%) according to the embodiment.

The horizontal axis in FIG. 10 indicates time, and the vertical axis indicates a plasma electron density (Ne). According to the measurement results illustrated in FIG. 10, in contrast to "CW" indicating Comparative Example, at the SSP ($\varphi=0°$), the plasma electron density (Ne) increased when the source power was turned ON, and decreased when the source power was turned OFF. As the bias power increased, the attenuation of the plasma electron density (Ne) increased when the HF was turned OFF. While the HF was turned OFF, a phenomenon occurred in which the plasma electron density (Ne) increased after the point in time immediately after the HF was turned OFF. At the SSP ($\varphi=0°$), at T=2000 ns, the LF has a negative peak, and a peak of the plasma electron density (Ne) appears while the HF is turned OFF. The reason why although the HF was turned OFF, the plasma electron density (Ne) increased after the point in time when the HF was turned OFF (T=1000 ns) will be described below in detail. However, it is simply thought that this is caused by ions existing for a while even after the HF is turned OFF. That is, it is thought that this is because the existing ions were accelerated within a sheath and collided with the substrate, by which secondary electrons were emitted and collided with a gas, and thus ions were further generated. Due to this phenomenon, the peak of ion energy on the high energy side may be increased. Next, process conditions for increasing the peak of ion energy on the high energy side will be described in Example 6.

Example 6

Figure 11:
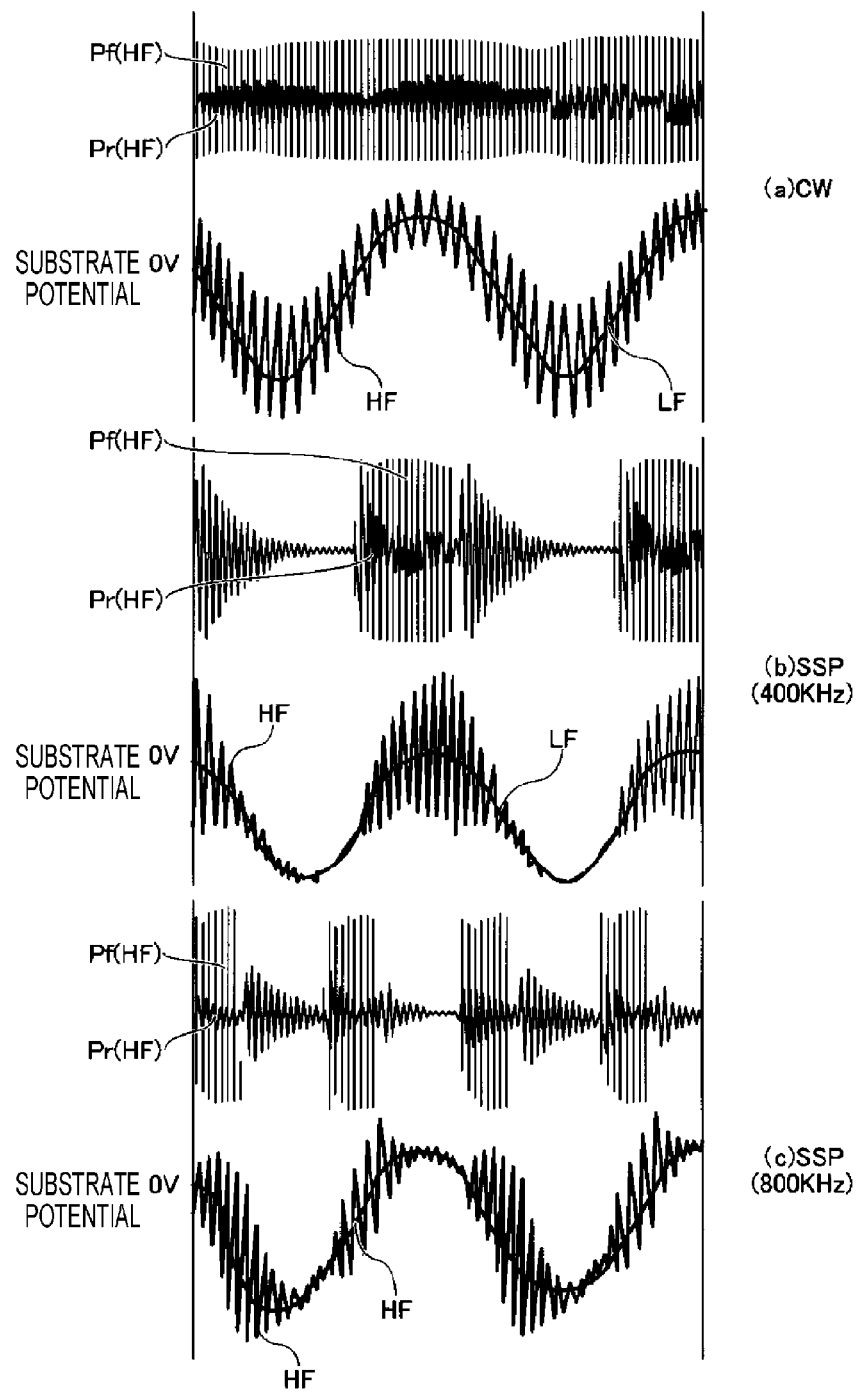
FIG. 11 is a view for explaining pulse application timings of the source power according to Example 6 of the embodiment.
Figure 12:
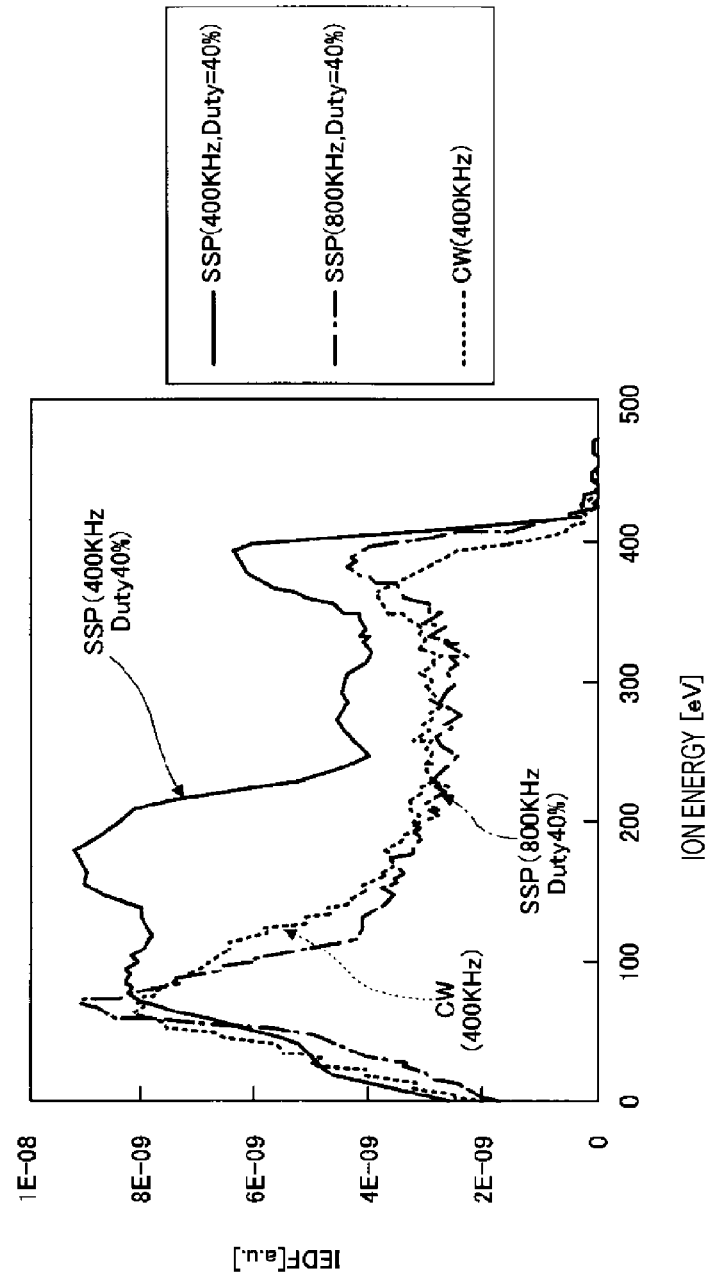
FIG. 12 is a view illustrating an example of the measurement result of the ion energy distributions at the pulse application timings of the source power at cycles of FIG. 11.

Descriptions will be made on Example 6 of the embodiment with reference to FIGS. 11 and 12. FIG. 11 is a view for explaining pulse application timings of the source power according to Example 6 of the embodiment. FIG. 12 is a view illustrating an example of the measurement result of the ion energy distributions at the pulse application timings of the source power at cycles of FIG. 11. In Example 6, at the SSP ($\varphi=0°$), the ON/OFF cycle of the source power was set to be once or twice the high frequency cycle of the bias power.

In the "CW" of Comparative Example illustrated in (a) of FIG. 11, since the HF is always turned ON, the traveling wave (Pf) and the reflection wave (Pr) of the HF are always output. In this case, the substrate potential oscillates at the HF voltage with respect to the LF voltage.

In FIG. 11, (b) and (c) illustrate application of the HF at the SSP ($\varphi=0°$) according to Example 6 of the embodiment. In (b) and (c) of FIG. 11, the HF is repeatedly turned ON and OFF at a duty ratio of 40%. In (b) of FIG. 11, the ON/OFF cycle of the source power is 400 kHz, which is the same as the high frequency cycle of the bias power. In (c) of FIG. 11, the ON/OFF cycle of the source power is 800 kHz, which is twice the high frequency cycle of the bias power.

Process conditions in Example 6 are as follows.

<Process Conditions>

| | |
|---|---|
| Gas | Argon |
| Pressure | 20 mTorr |
| LF | 50 W |
| HF | 100 W (average value), Duty = 40% |

Comparative Example: CW (LF=50 W, HF=Continuous Wave of 100 W)

The effective power of the source power in the "CW" of Comparative Example is the same as the effective power of the source power in the "SSP" (Duty=40%) according to the embodiment.

Among measurement results in FIG. 12, CW (400 kHz) is a measurement result in HF application illustrated in (a) of FIG. 11. SSP (400 kHz, Duty=40%) is a measurement result in HF application illustrated in (b) of FIG. 11, and SSP (800 kHz, Duty=40%) is a measurement result in HF application illustrated in (c) of FIG. 11.

The horizontal axis in FIG. 12 indicates ion energy, and the vertical axis indicates an ion energy distribution function (IEDF). In the case of the SSP (800 kHz, Duty=40%), the ion energy distribution has two peaks on the low energy and the high energy, and the number of ions having intermediate ion energy is decreased. Unlike in the case of the SSP (400 kHz, Duty=40%), no peak occurred around 180 (eV). In both the SSP (800 kHz, Duty=40%) and the SSP (400 kHz, Duty=40%), the peaks of the ion energy distribution occurred on the high energy side as compared to in the "CW" of Comparative Example. From the above, in the case of the SSP control, as compared to in Comparative Example, the number of high-energy ions that reached the substrate was increased. From the above, it was found that in the SSP control, the number of high-energy ions reaching the substrate may be increased when a control is performed such that the ON/OFF cycle of the source power becomes about twice the high frequency cycle of the bias power, and the source power is turned OFF at the negative peak of the LF voltage.

Example 7

Figure 13:
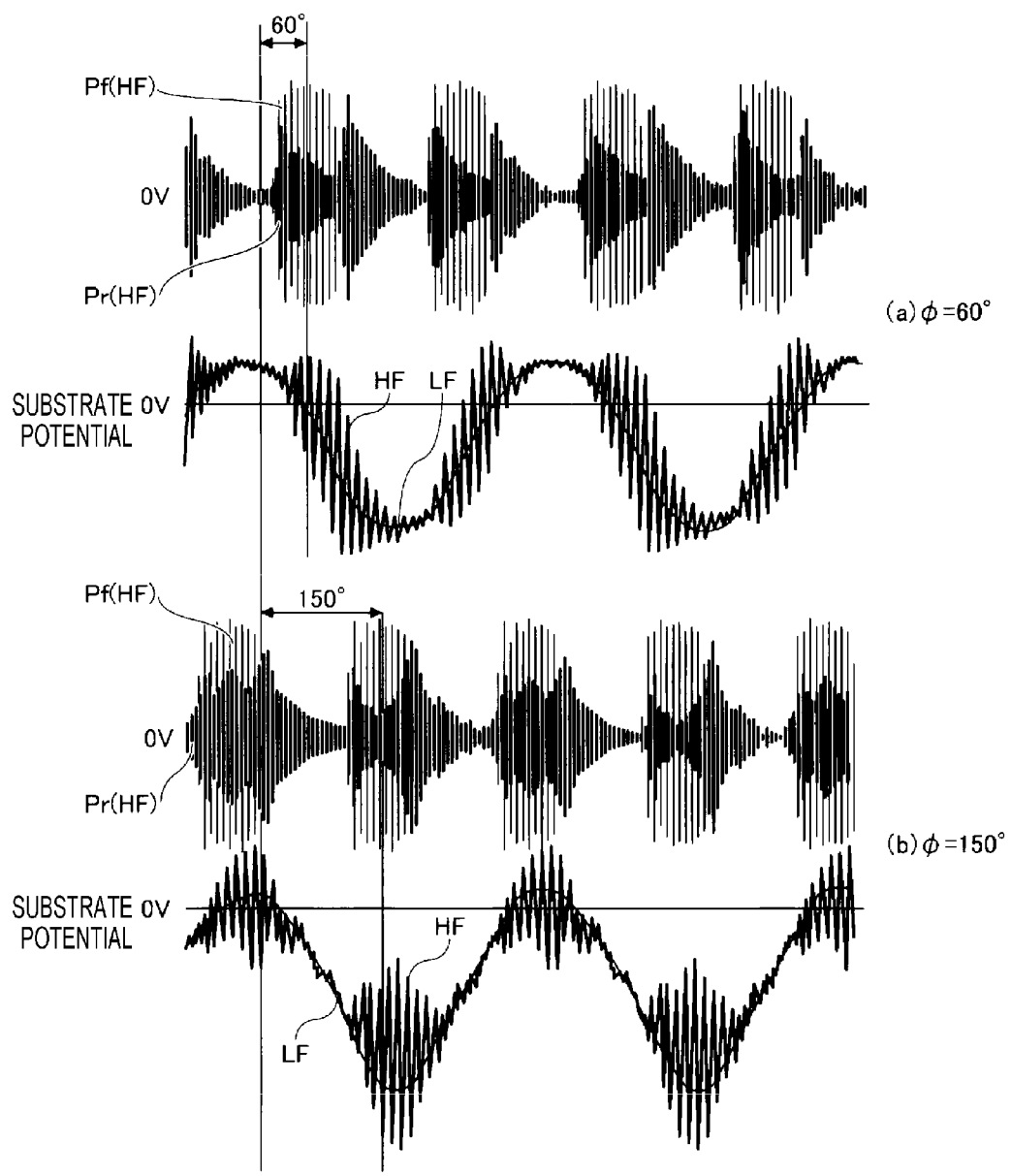
FIG. 13 is a view for explaining pulse application timings of the source power according to Example 7 of the embodiment.
Figure 14:
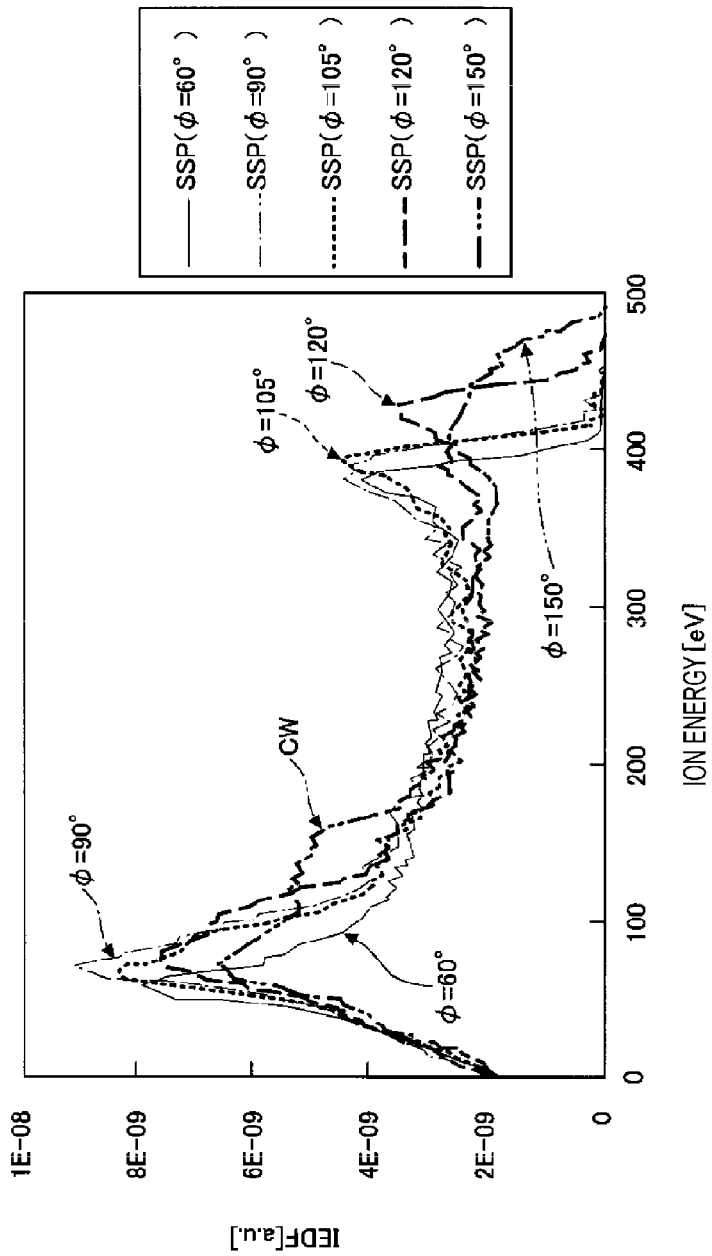
FIG. 14 is a view illustrating an example of the measurement result of ion energy distributions at the pulse application timings of the source power at the phases in FIG. 13.

Next, descriptions will be made on Example 7 of the embodiment with reference to FIGS. 13 and 14. FIG. 13 is a view for explaining phases of pulse application timings of the source power according to Example 7 of the embodiment. FIG. 14 is a view illustrating an example of the measurement result of the ion energy distributions at the phases of the pulse application timings of the source power in FIG. 13. In Example 7, ion energy was measured by shifting the phase of the HF pulse application timing (the intermediate size of the pulse period) with respect to 0° set for the time of the positive peak of the LF. FIG. 14 illustrates the IEDF measurement result when a control was made to shift a phase ($\varphi$) at which the source power is controlled to be turned ON, by 60°, 90°, 105°, 120°, and 150°, with respect to SSP ($\varphi=0°$).

In FIG. 13, (a) illustrates HF and LF waveforms, and a substrate potential in the case of SSP (φ=60°). In FIG. 13, (b) illustrates HF and LF waveforms, and a substrate potential in the case of SSP (φ=150°).

Process conditions in Example 7 are as follows.
<Process Conditions>

| Gas | Argon |
|---|---|
| Pressure | 20 mTorr |
| LF | 50 W |
| HF | 100 W (average value) (800 kHz, Duty = 40%) |

The phase (φ) was shifted with respect to SSP (φ=0°) by 60°, 90°, 105°, 120°, and 150°, and then it was measured how much the phase was shifted to obtain a preferable ion energy distribution. The preferable ion energy distribution refers to a distribution, in which the ion energy distribution has two peaks on the low energy and the high energy, and the number of ions having intermediate ion energy is small. It is desirable that the peak on the high energy side appears more clearly.

According to the measurement result of FIG. 14, in the ion energy distribution function, at the SSP (φ=120°), the peak on the high energy side is slightly expanded, and at the SSP (φ=150°), the peak on the high energy side is considerably broadened. That is, it was found that when the ON period of the HF pulse reaches near the time of the maximum negative value of the LF bias, the peak on the high energy side is broadened, and the height of the peak of the high energy is also decreased. From this result, it was found that it is desirable to turn OFF the HF in the vicinity of the maximum negative value of the LF. When the source power is controlled to be turned ON at the timing when the LF voltage is changed from negative to positive, in the case where the duty ratio of the source power is 50% or less, the HF may be turned OFF in vicinity of the maximum negative value of the LF.

Example 8

Figure 15:
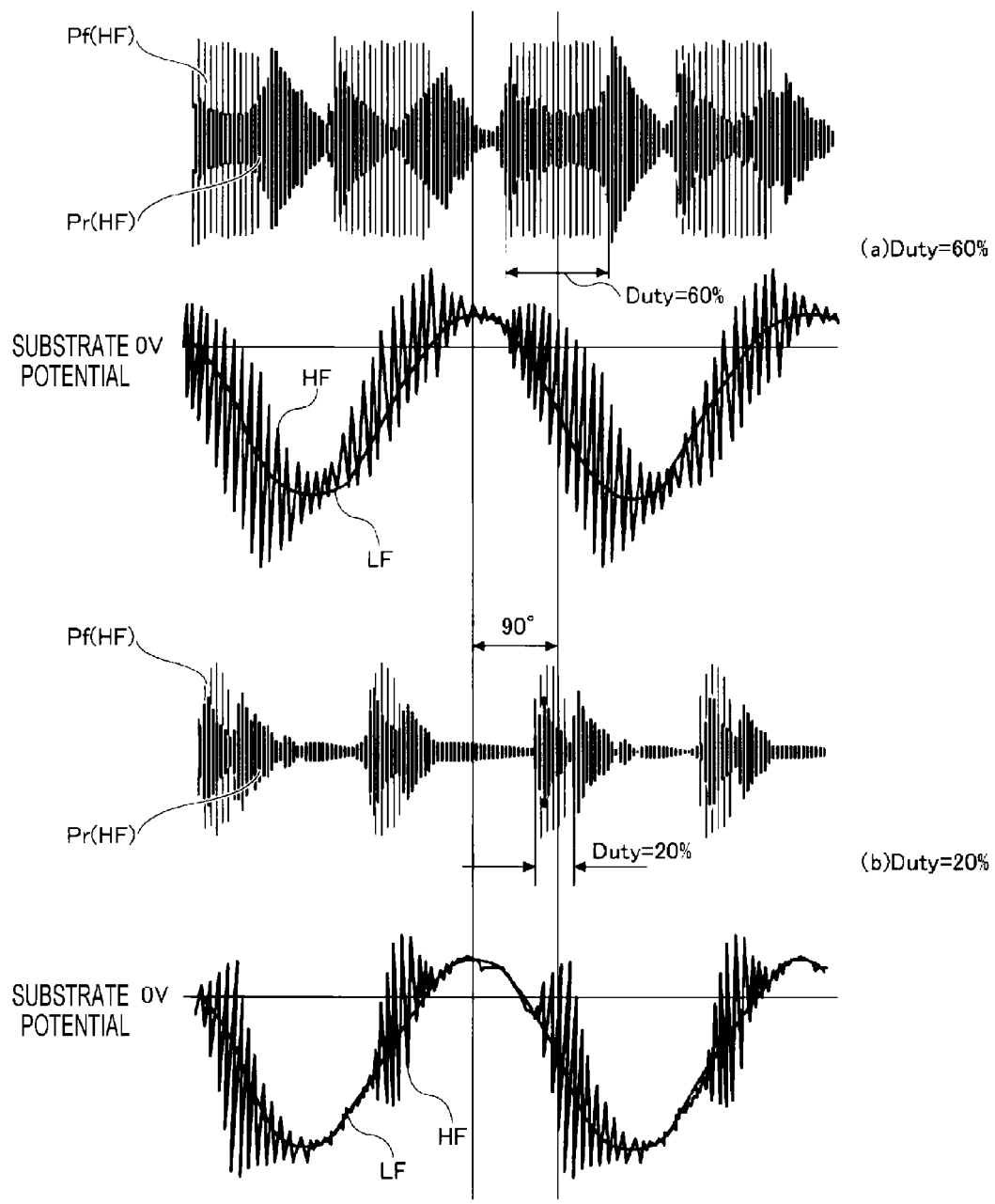
FIG. 15 is a view for explaining the duty ratio dependence of the source power according to Example 8 of the embodiment.
Figure 16:
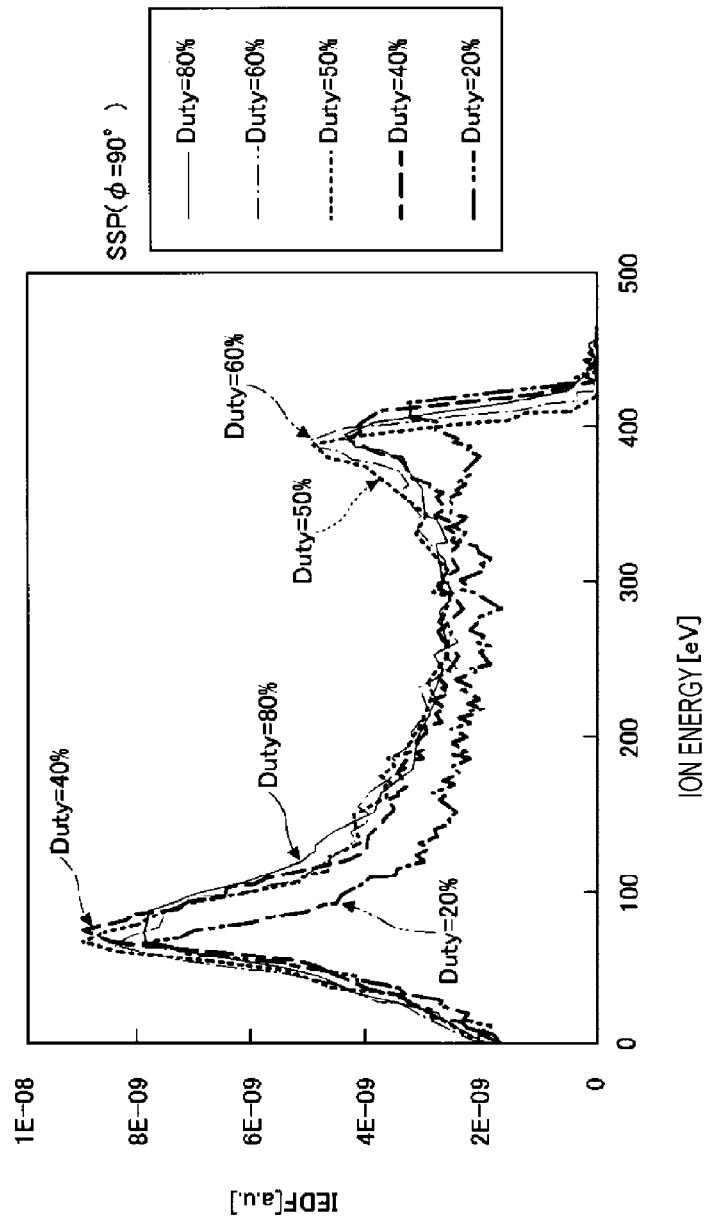
FIG. 16 is a view illustrating an example of the measurement result of the ion energy distributions by the duty ratios of source power pulses in FIG. 15.

Next, descriptions will be made on Example 8 of the embodiment with reference to FIGS. 15 and 16. In Example 8, the duty ratio of the source power was variably controlled. FIG. 15 is a view for explaining the duty ratio dependence of the source power according to Example 8 of the embodiment. FIG. 16 is a view illustrating an example of the measurement result of the ion energy distributions by the duty ratios of the source power pulses in FIG. 15.

In FIG. 15, (a) illustrates HF and LF waveforms, and a substrate potential when the duty ratio of the source power (HF) is 60%, at the SSP (φ=90°). In FIG. 15, (b) illustrates HF and LF waveforms, and a substrate potential when the duty ratio of the source power is 20%, at the SSP (φ=90°).

Process conditions in Example 8 are as follows.
<Process Conditions>

| Gas | Argon |
|---|---|
| Pressure | 20 mTorr |
| LF | 50 W |
| HF | 100 W (average value) (800 kHz, φ = 90°) |

At the SSP (φ=90°), the duty ratio of the source power pulse was set to 20%, 40%, 50%, 60%, and 80%, and it was measured how much the duty ratio was set to obtain a preferable ion energy distribution. According to the measurement result of FIG. 16, when the duty ratio of the source power was reduced to be less than 40% at the SSP (φ=90°), in the ion energy distribution, the peak on the high energy side was decreased. That is, it is thought that this is because when the duty ratio of the source power pulse was controlled to be less than 40% at the SSP (φ=90°), the ON time of the source power pulse was shortened, and the pulse was turned OFF before sufficient ions were generated, and thus, the total amount of ions that reached the substrate was decreased.

Therefore, it was found that when the duty ratio of the source power pulse is controlled to be less than 40%, the number of high-energy ions reaching the substrate is decreased, and thus, it is desirable that the duty ratio of the source power pulse is controlled to be 40% or more.

Example 9

Figure 17:
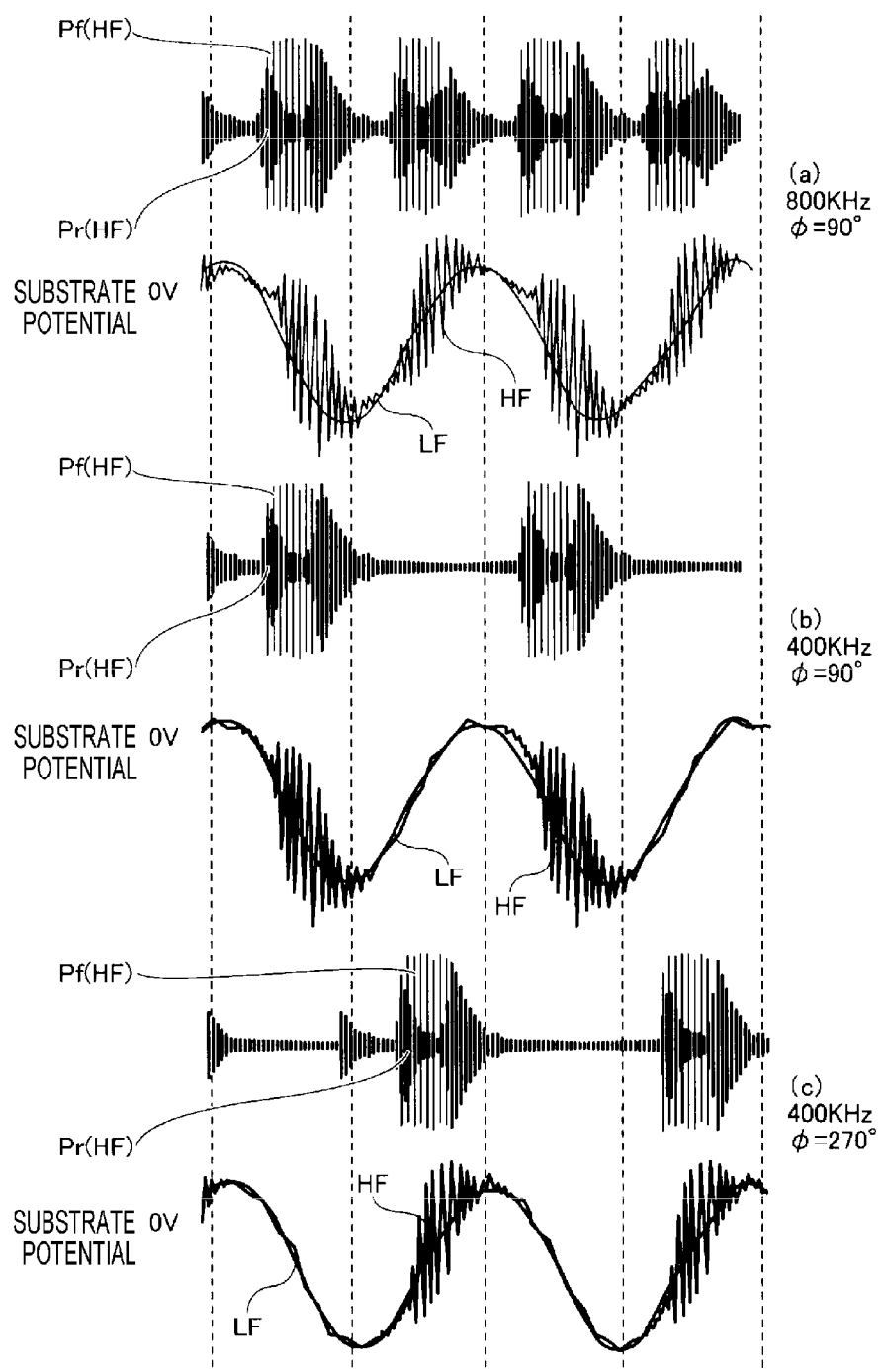
FIG. 17 is a view for explaining pulse application timings (phase dependence) of the source power according to Example 9 of the embodiment.
Figure 18:
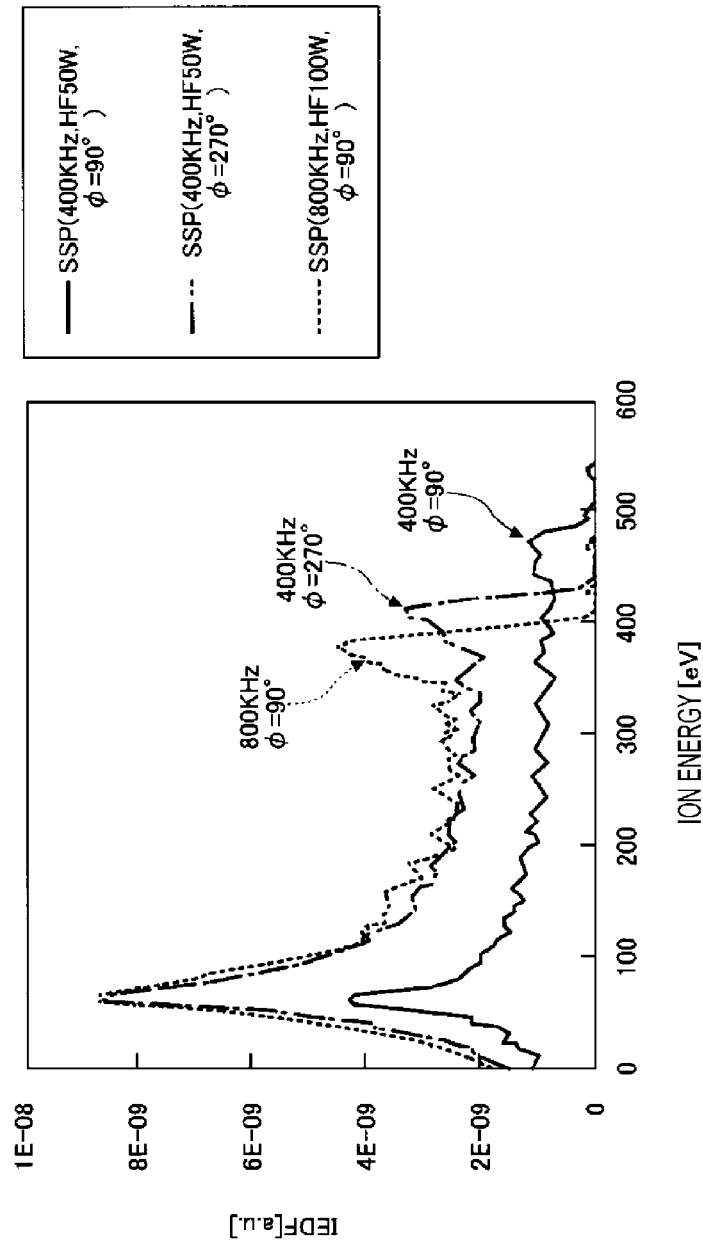
FIG. 18 is a view illustrating an example of the measurement result of the ion energy distributions at pulse application timings (phase dependence) of the source power in FIG. 17.

Next, descriptions will be made on Example 9 of the embodiment, with reference to FIGS. 17 and 18. FIG. 17 is a view for explaining phases of pulse application timings of the source power according to Example 9 of the embodiment. FIG. 18 is a view illustrating an example of the measurement result of the ion energy distributions at the phases of the pulse application timings of the source power in FIG. 17. In Example 9, the phase of the HF was controlled to be SSP (φ=90°) and SSP (φ=270°).

In FIG. 17, (a) illustrates HF and LF waveforms, and a substrate potential when the duty ratio of the source power pulse was 40%, and the ON/OFF cycle of the source power was set to 800 kHz, which is twice the high frequency cycle of the bias power, at the SSP (φ=90°).

In FIG. 17, (b) illustrates HF and LF waveforms, and a substrate potential when the duty ratio of the source power pulse was 20%, and the ON/OFF cycle of the source power was set to 400 kHz, which is the same as the high frequency cycle of the bias power, at the SSP (φ=90°).

In FIG. 17, (c) illustrates HF and LF waveforms, and a substrate potential when the duty ratio of the source power pulse was 20%, and the ON/OFF cycle of the source power was set to 400 kHz, which is the same as the high frequency cycle of the bias power, at the SSP (φ=270°).

Process conditions in Example 9 are as follows.
<Process Conditions>

| Gas | Argon |
|---|---|
| Pressure | 20 mTorr |
| LF | 50 W |
| HF | 100 W (average value) in (a) of FIG. 17 |
|  | 50 W (average value) in (b) and (c) of FIG. 17 |

According to the measurement result illustrated in FIG. 18, since IEDF distributions are almost the same at (a) φ=90° and 270° of the SSP (800 kHz), and (b) φ=270° of the SSP (400 kHz), it was found that the source power pulse phase at φ=90° does not contribute so much in the sense that ions are allowed to reach the substrate. At (c) φ=90° of the SSP (400 kHz), the amount of ions reaching the substrate is significantly small. From this result, it was found that the efficiency in causing ions to reach the substrate is highest when the HF is applied at the source power pulse phase of φ=270°.

[ON/OFF of HF, and Movement of Ions and Electrons]

Figure 19:
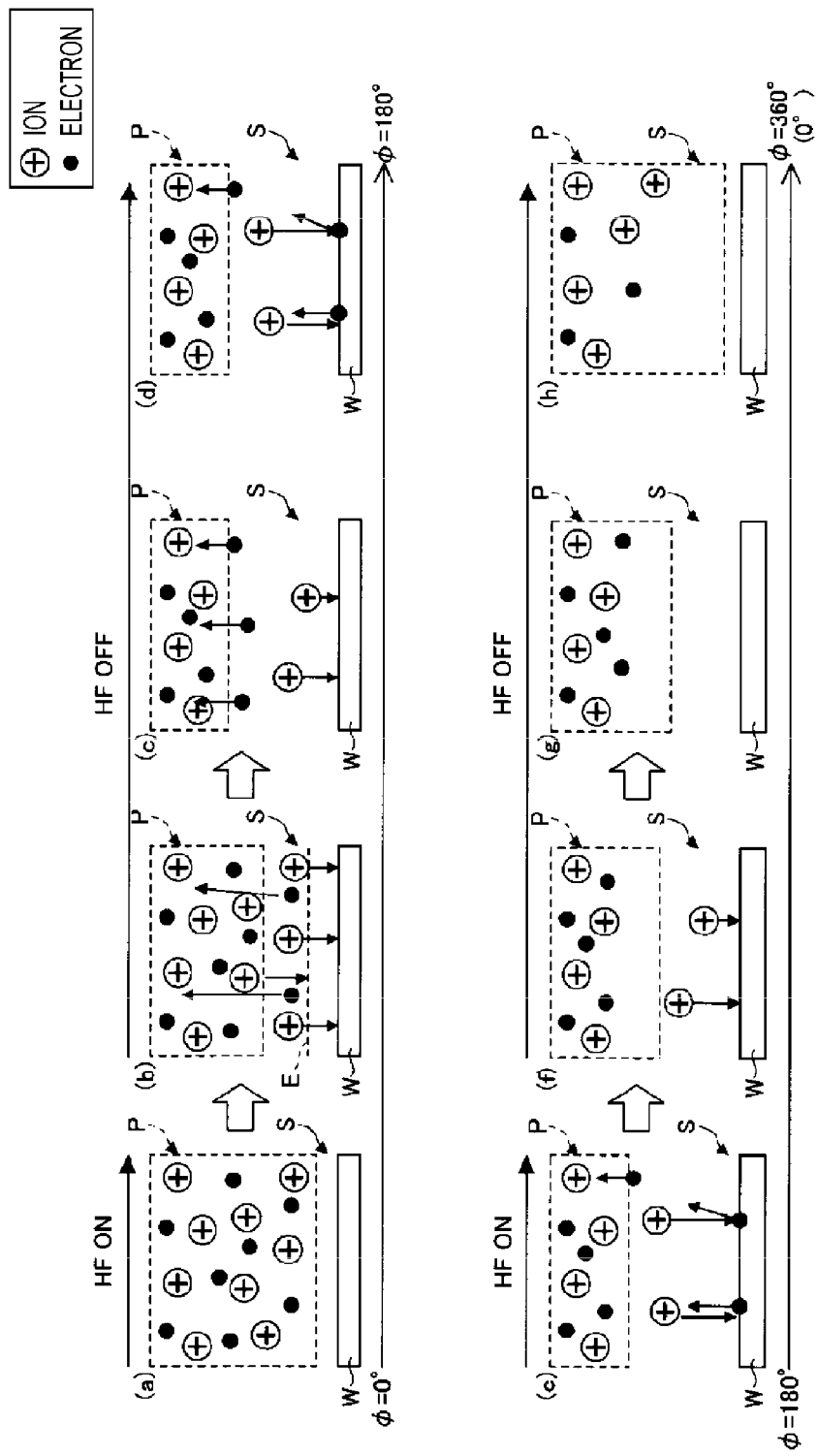
FIG. 19 is a view for explaining ON/OFF of HF and movement of ions and electrons according to the embodiment.

As illustrated in FIG. 10, when the HF pulse is turned OFF, the plasma electron density (Ne) is decreased. However, the electron density (Ne), which has once decreased, rises through a change from about T=1500 ns, and reaches a peak around T=2000 ns to 2250 ns. The reason the plasma electron density (Ne) has increased will be described with reference to FIG. 19. FIG. 19 is a view for explaining a sheath thickness, ON/OFF of the HF, and movement of ions and electrons according to the embodiment.

The sheath thickness is determined by a potential difference between the plasma potential and the substrate potential due to a bias voltage. Therefore, the sheath thickness is generally varied according to a bias cycle. When the LF bias has the maximum negative value, the sheath thickness becomes thickest, and conversely, during a period when the LF bias potential is positive, the sheath thickness is thin.

The LF voltage has the most positive peak ($\varphi=0°$) in (a) of FIG. 19, and then is gradually negatively deepened. In the vicinity of (c) of FIG. 19, $\varphi=90°$, and in (d) of FIG. 19, there is the most negative peak ($\varphi=180°$). In (a) of FIG. 19, at $\varphi=0°$, the source power is turned ON for a time corresponding to the duty ratio of the HF, and during (b) to (d) of FIG. 19, the source power is turned OFF.

In (a) of FIG. 19, while the source power is turned ON, plasma is generated, and no electric field is applied to electrons and ions existing in the plasma. Then, when the source power is turned OFF, the LF bias increases in the negative direction in the cycle of the LF bias. Accordingly, a sheath S becomes thick as illustrated in (b) to (d) of FIG. 19.

As illustrated in (b) of FIG. 19, when an electric field E is applied to electrons and ions as the sheath thickness becomes thick, the electrons having a small mass are accelerated in the direction of plasma P. Ions have a heavier mass than electrons, and thus are accelerated toward the substrate W while being delayed from movement of the electrons. The ions that have moved with a delay collide with the electrons that are already moving, and then are neutralized and disappear. As a result, as illustrated in (c) of FIG. 19, the numbers of ions and electrons are decreased.

However, high-speed ions accelerated toward the substrate W collide with the substrate W so that secondary electrons are emitted. The secondary electrons are accelerated in the direction of the plasma P by the electric field. The secondary electrons, which have high energy by being accelerated by the electric field, collide with a gas so that ions and electrons are generated. This phenomenon may be considered as a γ-mode DC discharge.

Accordingly, as illustrated in (d) of FIG. 19, although the source power is turned OFF, new ions and electrons are generated. Due to this phenomenon, as illustrated in FIG. 10, although the electron density decreases when the source power is turned OFF (T=1000 ns), subsequently, the plasma electron density (Ne) increases, and many high-energy ions reach the substrate. Due to such a phenomenon, the number of high-energy ions reaching the substrate may be increased, and the ion generation efficiency may be increased.

Meanwhile, when the source power is turned ON at $\varphi$ of 180° in (e) of FIG. 19, as illustrated in (f) to (h) of FIG. 19, the sheath S becomes thin. However, from the outset, the number of ions when $\varphi$ is 180° in (e) of FIG. 19 is smaller than when $\varphi$ is 0° in (a) of FIG. 19. Thus, in (f) to (h) of FIG. 19 in which the source power is turned OFF, the number of ions accelerated toward the substrate is small, and the acceleration of the ions toward the substrate is suppressed as the thickness of the sheath S gradually decreases. Thus, in (f) to (h) of FIG. 19 in which the source power is turned OFF, the cycle of ions→secondary electrons→ions→secondary electrons does not occur, unlike in (b) to (d) of FIG. 19 in which the source power is similarly turned OFF. Thus, it is difficult to increase the ion generation efficiency.

From the above, it was found that by controlling the ON time of the source power and the time until the bias power has the maximum negative value after the source power is turned OFF, it is possible to independently control the ion energy, and the ion amount corresponding to the plasma electron density and it is possible to increase the ion generation efficiency.

For example, it is desirable that the source power is turned ON at a timing when the sheath S is thin as illustrated in (a) of FIG. 19, and then the LF voltage is negatively deeply applied in a state where the source power is turned OFF. Accordingly, in ions and electrons, the action illustrated in (b) to (d) of FIG. 19 is promoted, and the ion generation efficiency is increased. Accordingly, the number of high-energy ions may be increased, and the plasma electron density (Ne) may be increased.

In particular, since the ion generation efficiency is increased through emission of secondary electrons by accelerated ions, it is desirable that the time during which the source power is controlled to be turned OFF is equal to or less than the time during which the density of ions generated during the ON time of the source power is equal to or more than a predetermined ion density. That is, it is desirable that the source power is controlled to be OFF in a period during which ions are remaining after the source power is turned OFF.

Figure 20:
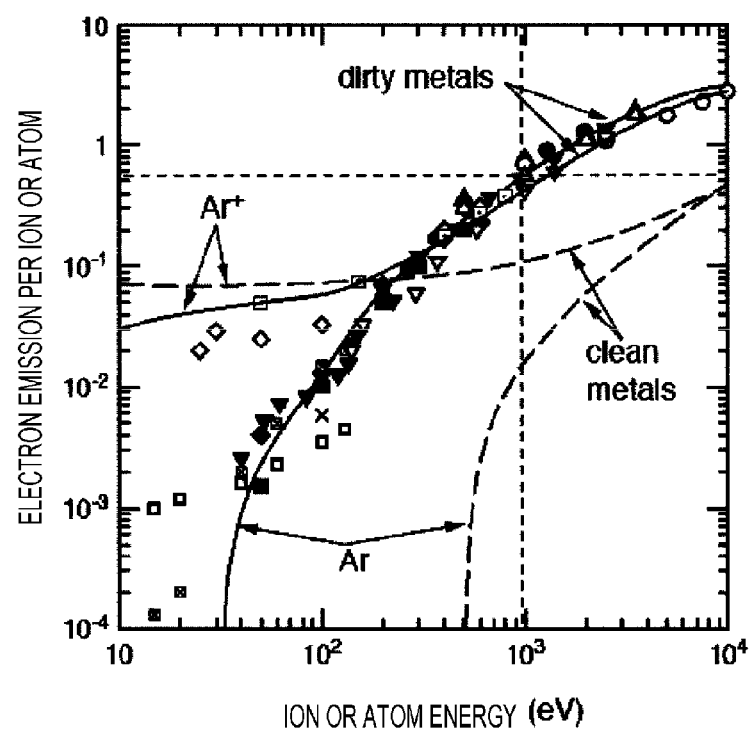
FIG. 20 is a view for explaining secondary electron emission of high energy ions.

"In a period during which ions are remaining after the source power is turned OFF" will be described with reference to FIG. 20. FIG. 20 is a view for explaining secondary electron emission of high energy ions. The source of FIG. 20 is [A V Phelps and Z Lj Petrovic] Plasma Sources Sci. Technol. 8(1999) R21-R44. Printed in the UK.

The horizontal axis in FIG. 20 indicates energy of ions, and the vertical axis indicates the number of secondary electrons emitted through ion collision. According to this, when Ar ions with 1000 (eV) collide with a substrate, about 0.5 secondary electrons are emitted. As the ion energy increases, the number of emitted secondary electrons rapidly increases. Then, the secondary electrons collide with a gas in a plasma processing space, thereby further generating ions, and the number of ions is further increased. Therefore, the time during which the source power is controlled to be OFF is controlled to be equal to or less than the time during which the density of ions generated during the ON time of the source power is equal to or more than a predetermined ion density. Accordingly, even though the source power is turned OFF, it is possible to make a generation cycle of ion generation→secondary electron emission→ion generation-→secondary electron emission only by bias power energy. Therefore, it is desirable to negatively deeply apply the LF voltage in a state where the source power is turned OFF.

Accordingly, monochromatization of ion energy on the high energy side may be achieved. Monochromatization of ion energy on the low energy side may be achieved. It is possible to control the ion energy distribution such that the distribution has two peaks on the low energy and the high energy, and the number of ions having intermediate ion energy is small.

[Modification]

Figure 21:
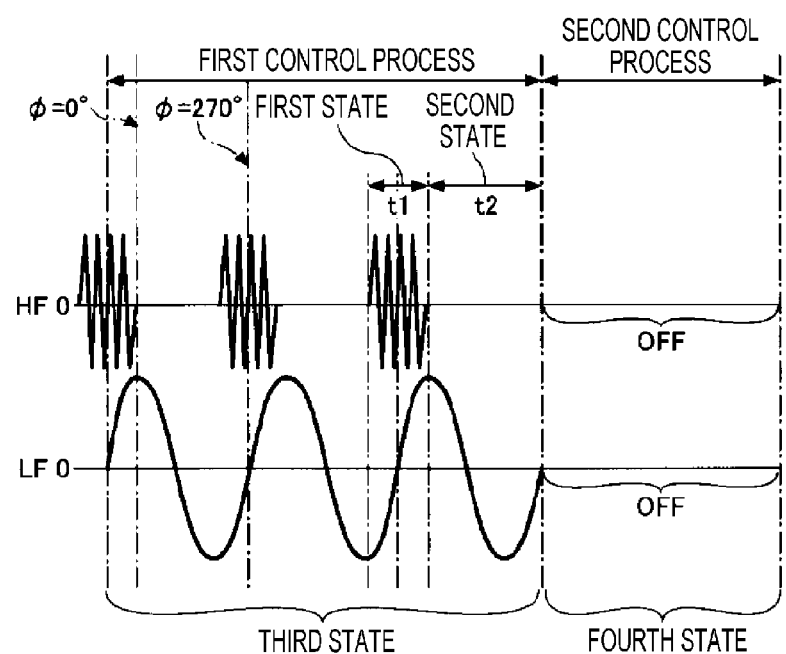
FIG. 21 is a view illustrating pulse application timings of the bias power and the source power according to the modification of the embodiment.

Next, descriptions will be made on application timings of bias power and source power according to a modification of the embodiment, with reference to FIG. 21. FIG. 21 is a view illustrating pulse application timings of the bias power and the source power according to the modification of the embodiment.

In the above Examples 1 to 10, the source power is applied with a predetermined duty ratio at a predetermined timing with respect to the bias power. In the modification of FIG. 21, when the phase of the bias power is φ=270°, the source power is synchronously turned ON. The time (t1) during which the source power is turned ON is set as a first state, and the time (t2) during which the source power is turned OFF is set as a second state. The processing method according to the modification includes a first control process of alternately applying the first state and the second state in synchronization with the phase within one cycle of the LF.

The processing method according to the modification includes a second control process of intermittently stopping the bias power and the source power, in addition to the first control process. In the second control process, the source power and the bias power are intermittently stopped at a cycle independent from the cycle of a reference electrical state exemplified by the LF voltage. The first control process and the second control process are repeatedly executed. In the modification, the ON/OFF cycle of the HF is the same as or an integer multiple of the LF cycle.

If the state of the first control process is a third state, and the state of the second control process is a fourth state, in the first control process and the second control process, the ratio of fourth state/(third state+fourth state) of the source power only has to fall within a range of 1% to 90%.

Figure 22A:
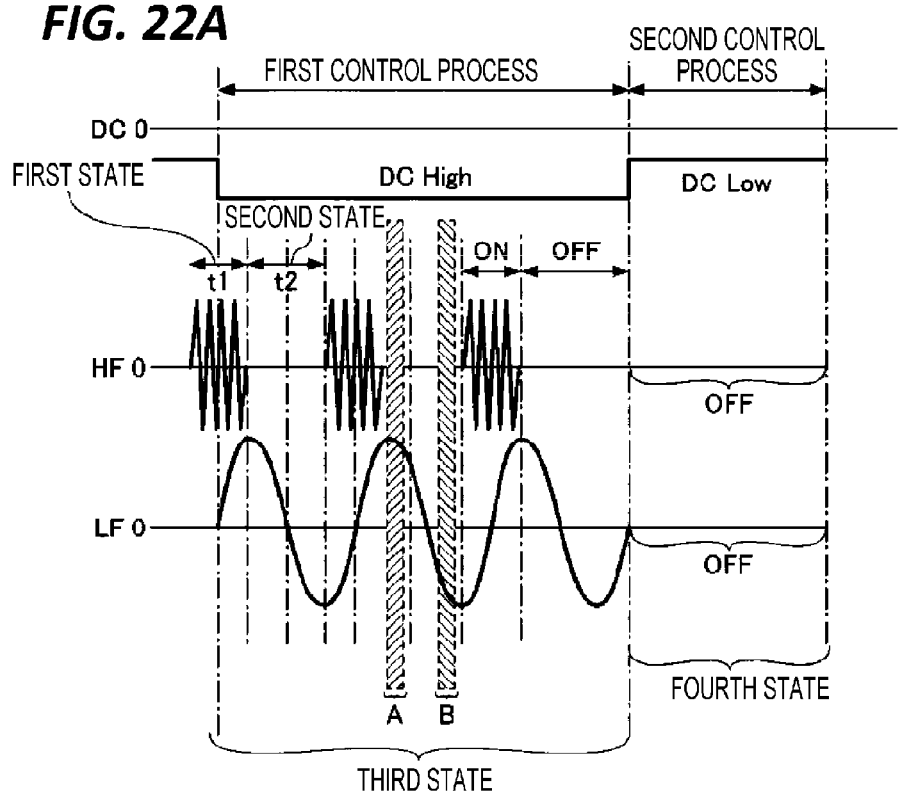
FIGS. 22A to 22C are views for explaining the movement of electrons during the OFF time of the source power, according to the embodiment.

In the example illustrated in FIG. 22A, in the first control process, the DC voltage applied to the upper electrode is controlled to be High as a negative value whose absolute value is higher than Low, and in the second control process, the DC voltage is controlled to be Low as a negative value whose absolute value is lower than High. In such a case, movements of electrons and ions will be described separately for the "A" timing and the "B" timing. "A" is the time during which a positive bias is applied to the substrate after the HF is turned OFF. "B" is the time during which a negative bias is applied to the substrate after the HF is turned OFF.

Figure 23:
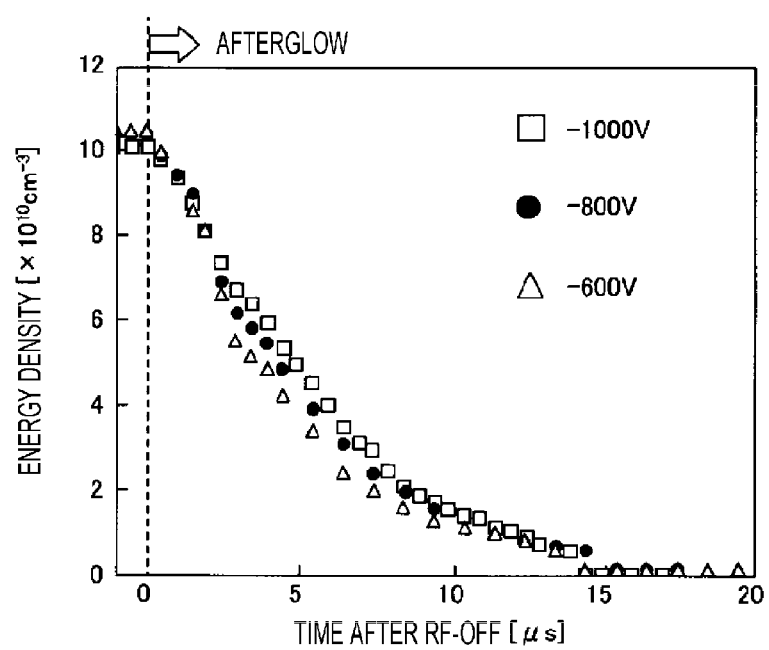
FIG. 23 is a view illustrating a time until electrons disappear after the source power is turned OFF.

FIG. 23 is a view illustrating a time until electrons disappear after the RF is turned OFF. The source is a literature of Dry Process Symposium 2018 E-2 (T. Tsutsumi et al). The horizontal axis indicates the time after the RF is turned OFF, and the vertical axis indicates the electron density (=ion density). The squares are a case where an RF of −1000 V was applied, the circles are a case where an RF of −800 V was applied, and the triangles are a case where an RF of −600 V was applied. According to this, at a point in time 5 µs after the HF is turned OFF, about ½ of ions remain. At a point in time 10 µs after the HF is turned OFF, about ⅕ of ions remain.

Figure 22B:
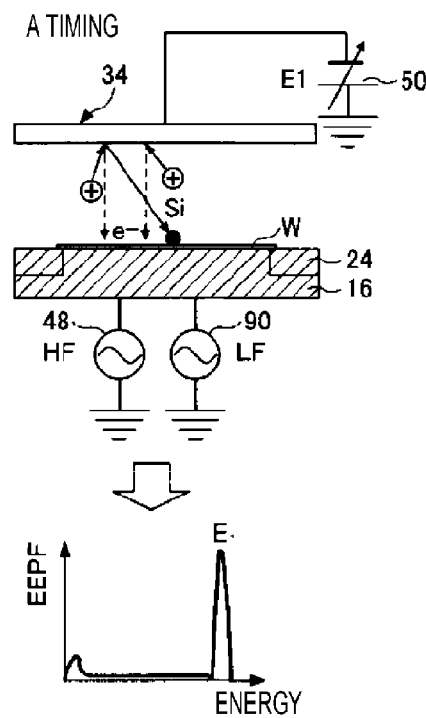

For example, when the source power is repeatedly turned ON and OFF at a cycle of 2.5 µs, it is thought that ions considerably remain while the source power is turned OFF. During "A" in which ions are remaining, when the DC voltage is controlled to be High and is applied to the upper electrode 34, the ions are accelerated toward the upper electrode 34 as illustrated in FIG. 22B. When the accelerated ions collide with the upper electrode 34, secondary electrons are emitted from the upper electrode 34. As illustrated in FIG. 22A, during the "A" time, the LF voltage is in a positive state, and during the "B" time, the LF voltage is in a negative state. Therefore, during the "A" time, the secondary electrons emitted from the upper electrode 34 are accelerated toward the lower electrode (the substrate W side) to which the positive bias is applied, as illustrated in FIG. 22B. As a result, during the "A" time, electrons with high energy (E1) indicated by an electron energy probability function (EEPF) on the vertical axis illustrated in a graph of FIG. 22B reach the substrate W. The upper electrode 34 sputters by the ions, and silicon in the surface layer of the upper electrode 34 reaches the substrate W.

Figure 22C:
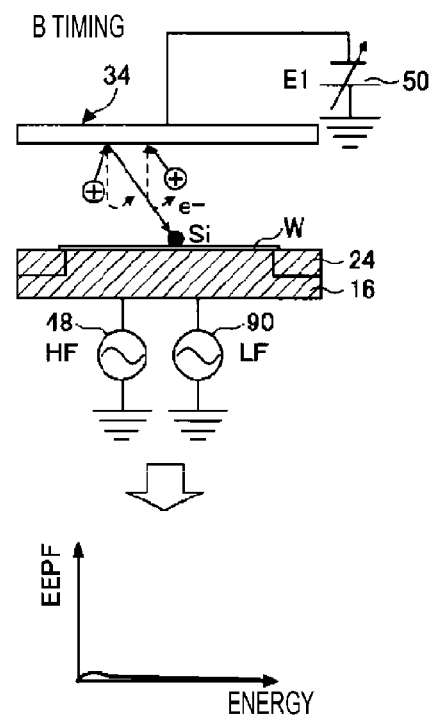

In contrast, during the "B" time, almost no ions remain. Thus, almost no ions are accelerated toward the upper electrode 34 as illustrated in FIG. 22C. "B" indicates the time when the LF is in a negative state. Therefore, at the timing of "B", a small number of secondary electrons are emitted from the upper electrode 34. Further, during the "B" time, since the LF voltage is in a negative state, the negative bias is applied to the lower electrode (the substrate W). Thus, the secondary electrons directed toward the substrate, which are emitted from the upper electrode 34, are bounced back by a negative electric field near the substrate W. As a result, during the "B" time, as illustrated in the graph of FIG. 22C, high-energy electrons do not reach the substrate W.

[ON/OFF of Source Power and Number of Electrons Reaching Substrate]

Figure 24:
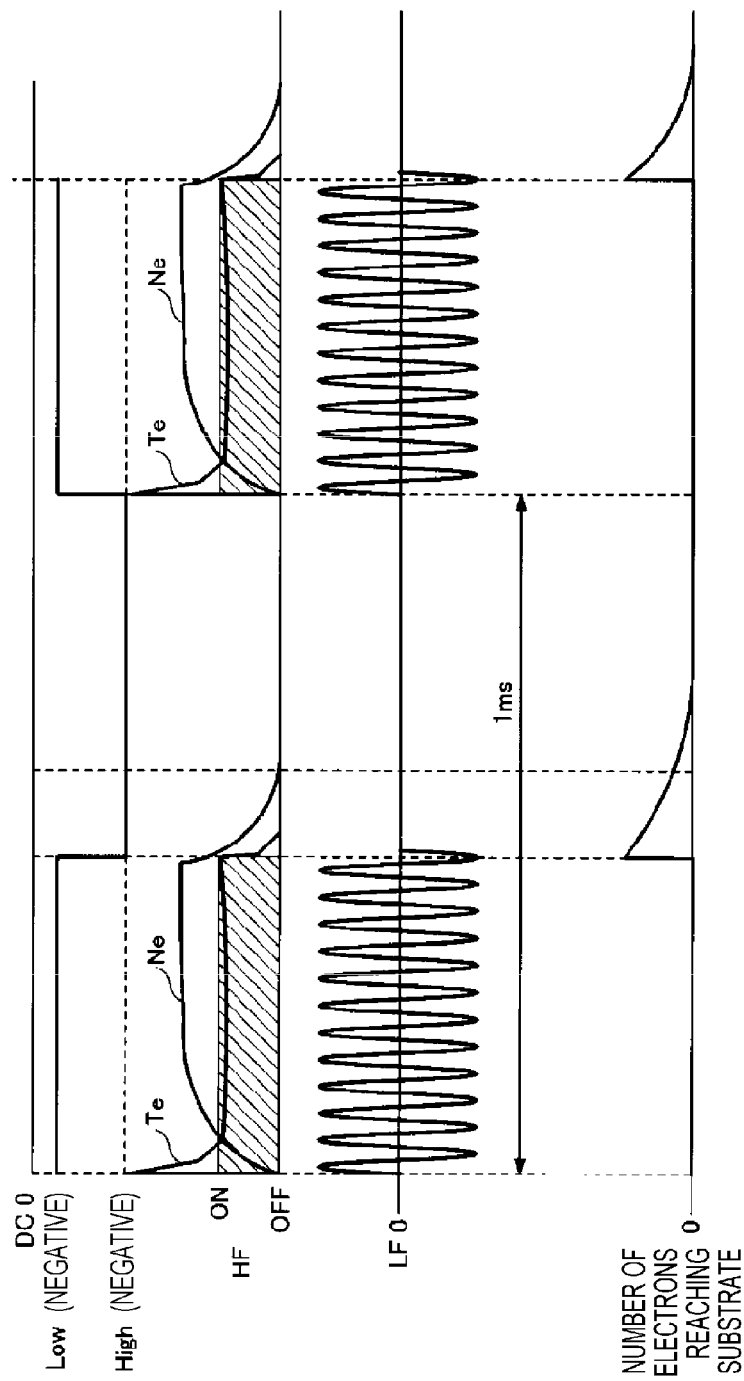
FIG. 24 is a view schematically illustrating ON/OFF of the source power and the number of electrons reaching the substrate, according to Comparative Example.
Figure 25:
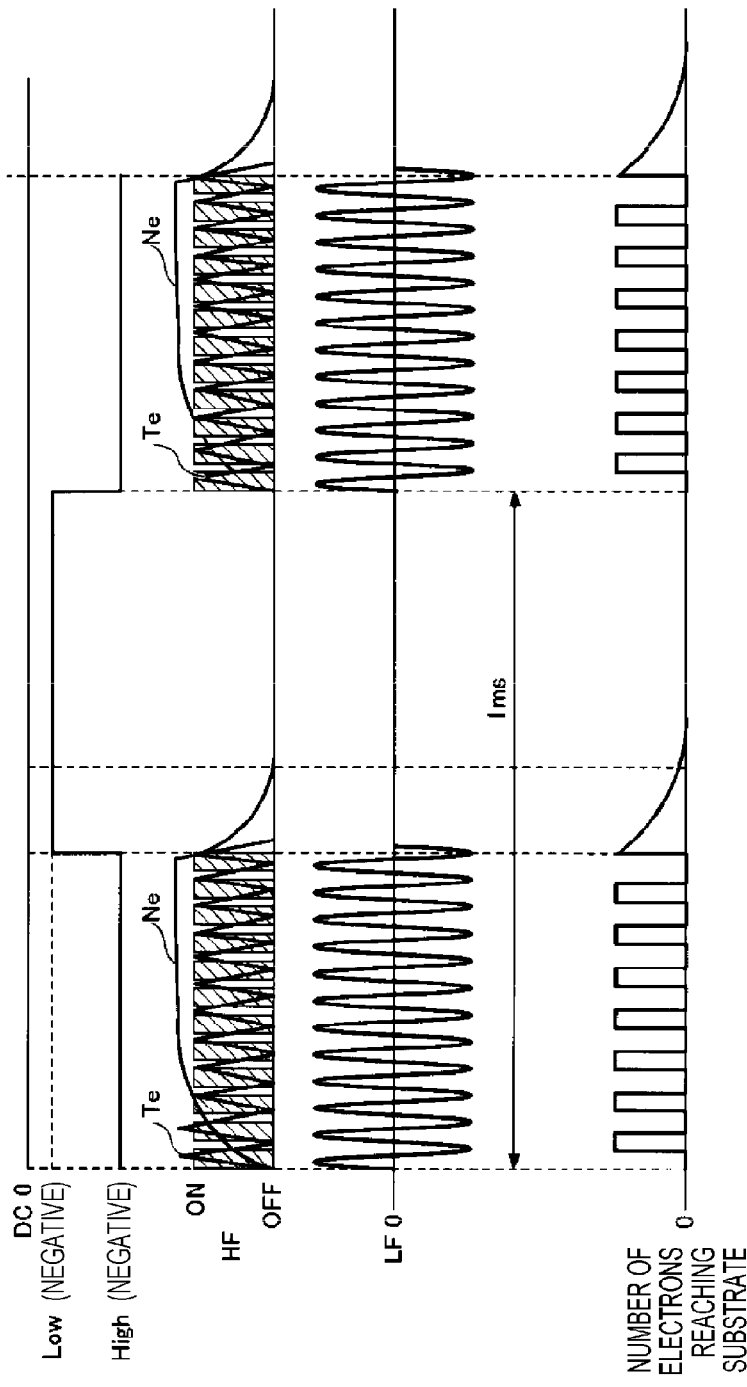
FIG. 25 is a view schematically illustrating ON/OFF of the source power and the number of electrons reaching the substrate, according to the embodiment.
Figure 26B:
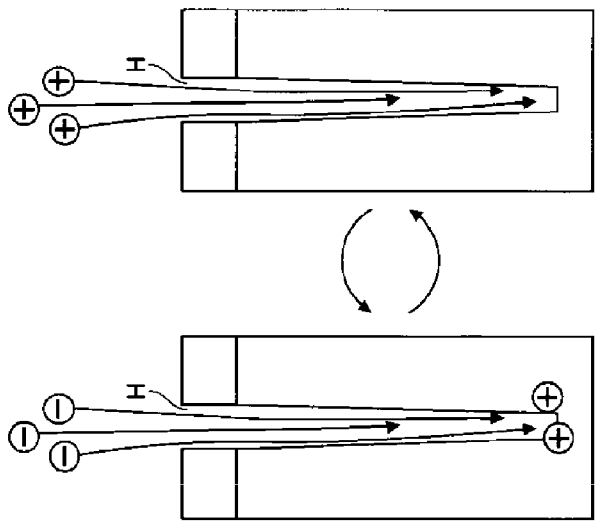
FIGS. 26A and 26B are views for explaining an ON/OFF timing of the source power and an effect thereof, according to the embodiment.
Figure 26A:
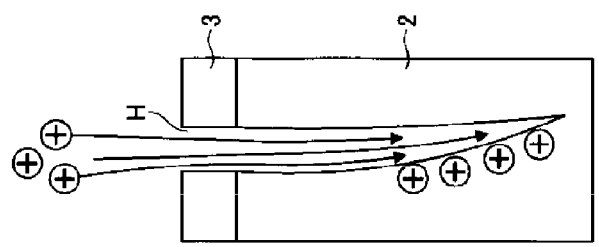

Next, descriptions will be made on ON/OFF of source power and the number of electrons reaching the substrate W, with reference to FIG. 24 to FIGS. 26A and 26B. FIG. 24 is a view schematically illustrating ON/OFF of the source power and the number of electrons reaching the substrate, according to Comparative Example. FIG. 25 is a view schematically illustrating ON/OFF of the source power and the number of electrons reaching the substrate, according to the embodiment. FIGS. 26A and 26B are views for explaining an ON/OFF timing of the source power and an effect thereof, according to the embodiment.

In Comparative Example illustrated in FIG. 24, while the LF is ON, the DC voltage is controlled to be a negative value whose absolute value is Low, and the HF is continuously applied. During this time, since the plasma has been generated, secondary electrons collide with the plasma and hardly reach the substrate. That is, as illustrated in FIG. 24, while the LF is ON, the number of electrons reaching the substrate is almost 0.

While the LF is OFF, the DC voltage is controlled to be a negative value whose absolute value is High, and the HF is not applied. During this time, the plasma is not generated. Thus, while ions are remaining after the LF is turned OFF, the ions are accelerated toward the upper electrode 34, and collide with the upper electrode 34 so that secondary electrons are emitted. The secondary electrons reach the substrate. Therefore, as illustrated in FIG. 24, while the LF is OFF, for about 5 µs to 10 µs after the LF is turned OFF, during which ions are remaining, electrons reach the substrate, and the other time is a useless time during which electrons do not reach the substrate.

In contrast, at the SSP according to the embodiment illustrated in FIG. 25, while the LF is ON, the DC voltage is controlled to be a negative value whose absolute value is High, and the HF is applied in synchronization with the LF phase such that the HF is controlled to be OFF at least at the negative side peak of a phase within one cycle of the reference electrical state. While the HF is ON, plasma is generated, and secondary electrons collide with the plasma and do not reach the substrate. However, since ions are remaining while the HF is OFF, the ions are accelerated toward the upper electrode 34, and collide with the upper electrode 34 so that secondary electrons are emitted. The secondary electrons reach the substrate.

While the LF is OFF, the DC voltage is controlled to be a negative value whose absolute value is Low, and the HF is not applied. During this time, the plasma is not generated. Thus, while ions are remaining after the LF is turned OFF, the ions are accelerated toward the upper electrode 34, and collide with the upper electrode 34 so that secondary electrons are emitted. The secondary electrons reach the substrate. Therefore, as illustrated in FIG. 25, while the LF is OFF, for about 5 μs to 10 μs after the LF is turned OFF, during which ions are remaining, electrons reach the substrate. While the LF is ON and the HF is OFF, since ions are remaining, electrons reach the substrate. From the above, at the SSP according to the embodiment, the number of electrons reaching the substrate increases, and thus the plasma electron density becomes higher than that in the case of Comparative Example. The number of ions increases, and thus the ion generation efficiency increases.

FIG. 26A illustrates an example of etching in the case of Comparative Example. FIG. 26B illustrates an example of etching in the case of SSP according to the embodiment. When the etching target film 2 is etched into a pattern of a hole H formed in the mask 3, ions and electrons, which have reached the substrate, enter. In the case of Comparative Example in FIG. 26A, electrons are lighter than ions, and thus may adhere to the side wall of the hole H while not reaching the bottom of the hole H. Then, the bottom of the hole H is positively charged up by ions having high straightness. Ions, which have entered into the hole H thereafter, obliquely enter because the hole bottom is charged up. Then, the ions do not reach the bottom of the hole H. As a result, as illustrated in FIG. 26A, the verticality of the etching shape of the hole H is degraded.

In contrast, in the case of SSP according to the embodiment illustrated in FIG. 26B, as illustrated in FIG. 25, the number of electrons reaching the substrate is larger than that in Comparative Example. While the LF is ON, the HF is repeatedly turned ON/OFF. In this case, in the case of SSP according to the embodiment, as illustrated in FIG. 26B, electrons are accelerated and reach the substrate, and then ions are accelerated and reach the substrate. This process is repeated. Accordingly, charging is canceled before the bottom of the hole H is charged up. Thus, the verticality of the etching shape of the hole H is maintained.

[Effect]

Finally, configurations and effects of the embodiment and the modification will be summarized. First, when performing SSP control in which source power is intermittently applied at a predetermined timing in synchronization with bias power, the controller 200 performs a control to turn OFF the source power at least at the negative side peak of a phase within one cycle of a reference electrical state. Accordingly, the ion energy distribution may be controlled. Also, the in-plane distribution of a plasma electron density may be controlled. Then, the plasma electron density and the ion energy may be independently controlled.

As illustrated in FIG. 25, since the number of electrons reaching the substrate, with the same average power, increases, an efficient plasma electron density may be obtained. It is possible to achieve monochromatization of ion energy on the high energy side and monochromatization of ion energy on the low energy side. In a state where the LF voltage is negative, it is possible to suppress a reduction of a plasma electron density.

By the controller 200, the time during which the source power is controlled to be OFF is controlled to be equal to or less than the time during which the density of ions generated during the ON time of the source power is equal to or more than a predetermined ion density. That is, by the controller 200, the time during which the source power is controlled to be OFF is controlled to be shorter than the time until a certain amount or more of ions generated during the ON time of the source power disappear. Accordingly, even though the source power is turned OFF, the plasma electron density (ion density) may be made higher than immediately after the source power is turned OFF.

When the source power is turned ON, a substrate potential oscillates with the amplitude of the source power. Accordingly, electrons having a light mass move first, and ions having a heavy mass move after the electrons so that the ions are neutralized by colliding with the electrons. Thus, ions reaching the substrate are decreased. That is, when the source power is turned ON, high-energy ions reaching the substrate are decreased. However, in the embodiment and the modification, the controller 200 intermittently applies the source power in synchronization with the bias power, and the source power is controlled to be OFF at least at a peak of a phase within one cycle of the reference electrical state. Accordingly, the number of high-energy ions reaching the substrate may be increased as compared to that in the case where the source power is continuously applied.

A plasma generation source for generating plasma is executed when source power of a radio-frequency power supply is supplied to a plasma processing space, but the present disclosure is not limited thereto. In the execution, source power of another power supply such as a microwave source may be supplied to a plasma processing space.

The plasma processing apparatus of the present disclosure is applicable to any type of apparatus such as an atomic layer deposition (ALD) device, a capacitively coupled plasma (CCP) device, an inductively coupled plasma (ICP) device, a radial line slot antenna (RLSA), an electron cyclotron resonance (ECR) plasma device, and a helicon wave plasma (HWP) device.

According to one aspect, ion energy distribution may be controlled.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for plasma processing comprising:
a first electrode on which a substrate is placed;
a second electrode that faces the first electrode;
a bias power supply configured to supply a bias power to the first electrode;
a source power supply configured to supply a source power having a frequency higher than that of the bias power to either the first electrode or the second electrode to generate plasma, the source power having a first state and a second state; and
a controller configured to control the bias power supply and the source power supply,
wherein the controller performs a control to alternately apply the source power of the first state and the second state in synchronization with a signal synchronized with a high frequency cycle of the bias power, or a phase within one cycle of a reference electrical state that represents any one of a voltage, a current, and an electromagnetic field measured in a power feed system of the bias power, and
the controller performs a control to turn OFF the source power at least at a negative peak of the phase within one cycle of the reference electrical state and to turn ON the source power at a timing when the phase within one cycle of the reference electrical state changes from negative to positive.

2. The apparatus according to claim 1, wherein the controller controls a time during which the source power is controlled to be OFF to be equal to or less than a time during which a density of ions generated when the source power is ON is equal to or more than a predetermined ion density.

3. The apparatus according to claim 1, wherein the controller sets an ON/OFF cycle of the source power to be twice the high frequency cycle of the bias power, and controls the source power to be turned OFF at a negative peak of the phase within one cycle of the reference electrical state.

4. The apparatus according to claim 1, wherein the controller controls a duty ratio of the source power to be 40% or more.

5. The apparatus according to claim 1, wherein the controller intermittently stops the bias power and the source power.

6. The apparatus according to claim 1, wherein a value of the source power in the second state is 0.

7. A method of processing comprising:
providing a plasma processing apparatus including: a first electrode on which a substrate is placed; a second electrode that faces the first electrode; a bias power supply that supplies bias power to the first electrode; and a source power supply that supplies a source power having a frequency higher than that of the bias power to either the first electrode or the second electrode to generate plasma,
setting the source power to be in a first state and a second state,
alternately applying the source power of the first state and the second state in synchronization with a signal synchronized with a high frequency cycle of the bias power, or a phase within one cycle of a reference electrical state that represents any one of a voltage, a current, and an electromagnetic field measured in a power feed system of the bias power, and
controlling the source power to be turned OFF at least at a negative peak of the phase within one cycle of the reference electrical state and to be turned ON at a timing when the phase within one cycle of the reference electrical state changes from negative to positive.

8. The method according to claim 7, further comprising:
controlling a time during which the source power is controlled to be OFF to be equal to or less than a time during which a density of ions generated when the source power is ON is equal to or more than a predetermined ion density.

9. The method according to claim 7, further comprising:
controlling an ON/OFF cycle of the source power to be twice the high frequency cycle of the bias power, and controlling the source power to be turned OFF at a negative peak of the phase within one cycle of the reference electrical state.

10. The method according to claim 7, further comprising:
controlling a duty ratio of the source power to be 40% or more.

11. The method according to claim 7, further comprising:
intermittently stopping the bias power and the source power.

12. The method according to claim 7, wherein a value of the source power in the second state is 0.

13. The apparatus according to claim 5, wherein the controller intermittently stops the bias power and the source power at a cycle independent from a cycle of the reference electrical state.

14. The apparatus according to claim 5, wherein the controller repeatedly executes the alternately applying the source power of the first state and the second state and the intermittently stopping the bias power and the source power.

15. The apparatus according to claim 1, further comprising:
a variable voltage-type DC power supply configured to apply a DC voltage to the second electrode,
wherein the controller controls the variable voltage-type DC power supply such that the DC voltage remains "High" as a negative value whose absolute value is higher than "Low" during the control to alternately apply the source power of the first state and the second state.

* * * * *